United States Patent
Keum et al.

(10) Patent No.: US 12,176,366 B2
(45) Date of Patent: Dec. 24, 2024

(54) IMAGE SENSOR WITH VARYING SAME-COLOR COLOR FILTER THICKNESS

(71) Applicant: SAMSUNG ELECTRONICS CO., LTD., Suwon-si (KR)

(72) Inventors: Dong Min Keum, Daegu (KR); Yun Ki Lee, Hwaseong-si (KR); Jun Sung Park, Hwaseong-si (KR); Dong Kyu Lee, Suwon-si (KR); Bum Suk Kim, Hwaseong-si (KR); Kwang Hee Lee, Hwaseong-si (KR); Tae Sung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/453,253

(22) Filed: Nov. 2, 2021

(65) Prior Publication Data
US 2022/0285415 A1    Sep. 8, 2022

(30) Foreign Application Priority Data

Mar. 3, 2021    (KR) .................. 10-2021-0027796

(51) Int. Cl.
*H01L 27/146* (2006.01)
*H04N 25/79* (2023.01)

(52) U.S. Cl.
CPC .. *H01L 27/14621* (2013.01); *H01L 27/14603* (2013.01); *H01L 27/14627* (2013.01); *H01L 27/1463* (2013.01); *H01L 27/14643* (2013.01); *H01L 27/14645* (2013.01); *H01L 27/14685* (2013.01); *H01L 27/14683* (2013.01); *H04N 25/79* (2023.01)

(58) Field of Classification Search
None
See application file for complete search history.

(56) References Cited

U.S. PATENT DOCUMENTS

| 7,629,662 B2 | 12/2009 | Lee |
| 7,875,840 B2 | 1/2011 | Jiang et al. |
(Continued)

FOREIGN PATENT DOCUMENTS

| JP | 2008021753 | 1/2008 |
| KR | 10-2007-0071016 | 7/2007 |
(Continued)

*Primary Examiner* — Jennifer D Bennett
*Assistant Examiner* — Erin R Garber
(74) *Attorney, Agent, or Firm* — F. CHAU & ASSOCIATES, LLC

(57) ABSTRACT

An image sensor that provides a uniform sensitivity for pixels having color filters of the same color to increase the image quality is provided. The image sensor includes a substrate, a first grid pattern disposed on the substrate and including a first side wall and a second side wall opposite to the first side wall, a first pixel including a first photoelectric conversion element and a first color filter, and a second pixel including a second photoelectric conversion element and a second color filter. The first color filter contacts the first side wall and the second color filter contacts the second side wall. The first color filter and the second color filter are color filters of same color, and a first thickness of the first color filter is greater than a second thickness of the second color filter.

17 Claims, 22 Drawing Sheets

(56) References Cited

U.S. PATENT DOCUMENTS

| | | | |
|---|---|---|---|
| 8,030,116 B2* | 10/2011 | Jun | H01L 27/14621 |
| | | | 257/E31.127 |
| 8,071,416 B2 | 12/2011 | Liu et al. | |
| 8,558,338 B2 | 10/2013 | Tsuji | |
| 8,704,920 B2 | 4/2014 | Hsu | |
| 9,360,607 B1* | 6/2016 | Tai | H04N 25/134 |
| 10,553,631 B2 | 2/2020 | Chu et al. | |
| 10,666,881 B2 | 5/2020 | Kaneko et al. | |
| 2007/0103572 A1* | 5/2007 | Yokozawa | H01L 27/14627 |
| | | | 348/272 |
| 2008/0164551 A1* | 7/2008 | Yun | H01L 27/14621 |
| | | | 257/E31.127 |
| 2009/0040345 A1* | 2/2009 | Fukuyoshi | H01L 27/14621 |
| | | | 438/70 |
| 2015/0171126 A1* | 6/2015 | Seki | H01L 27/14685 |
| | | | 438/69 |
| 2016/0065916 A1* | 3/2016 | Ishioka | G03F 7/40 |
| | | | 430/7 |
| 2016/0307943 A1* | 10/2016 | Cheng | H01L 27/14685 |
| 2018/0286904 A1* | 10/2018 | Tazoe | H01L 27/14621 |
| 2020/0258929 A1* | 8/2020 | Imoto | H01L 27/14685 |
| 2020/0403025 A1* | 12/2020 | Kim | H01L 27/1464 |
| 2021/0066374 A1* | 3/2021 | Kim | H01L 27/14645 |
| 2021/0118929 A1* | 4/2021 | Yang | H01L 27/14623 |
| 2021/0281750 A1* | 9/2021 | Vu | H01L 27/14627 |
| 2021/0288090 A1* | 9/2021 | Li | H01L 27/14627 |
| 2022/0190019 A1* | 6/2022 | Liu | H01L 27/14685 |

FOREIGN PATENT DOCUMENTS

| | | |
|---|---|---|
| KR | 10-2011-0079276 | 7/2011 |
| WO | WO99065248 A1 | 12/1999 |

* cited by examiner

IMAGE SENSOR WITH VARYING SAME-COLOR COLOR FILTER THICKNESS

This application claims priority under 35 USC § 119 to Korean Patent Application No. 10-2021-0027796 filed on Mar. 3, 2021 in the Korean Intellectual Property Office, the disclosure of which is incorporated by reference herein in its entirety.

TECHNICAL FIELD

The present disclosure relates to an image sensor. More particularly, the present disclosure relates to an image sensor with pixels that have uniform sensitivity.

DISCUSSION OF THE RELATED ART

Electronic devices often include image sensors. An image sensor is a semiconductor component that is capable of converting optical information into electric signals. Accordingly, image sensors are often used to provide image capturing functionality for electronic devices. Types of image sensors include charge coupled device (CCD) image sensors and complementary metal-oxide semiconductor (CMOS) image sensors.

The CMOS image sensor may be abbreviated as a CIS (CMOS image sensor). The CIS may have multiple pixels arranged two-dimensionally. Each of the pixels may include a photodiode (PD). The photodiode may convert incident light into electrical signals.

Image sensors are used in various applications, such as for digital cameras, video cameras, smart phones, game machines, security cameras, medical micro cameras, and robots. There has been continued research in the field of image sensors to increase the quality of images produced.

SUMMARY

Aspects of the present disclosure provide an image sensor that provides a uniform sensitivity for pixels having color filters of the same color to increase the image quality.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, the image sensor includes a substrate, a first grid pattern disposed on the substrate and including a first side wall and a second side wall opposite to the first side wall, a first pixel including a first photoelectric conversion element and a first color filter, and a second pixel including a second photoelectric conversion element and a second color filter. The first color filter contacts the first side wall, the second color filter contacts the second side wall, the first photoelectric conversion element and the second photoelectric conversion element are disposed inside the substrate, the first color filter and the second color filter are disposed on the substrate, the first color filter and the second color filter are color filters of same color, and a first thickness of the first color filter is greater than a second thickness of the second color filter.

According to embodiments of the present disclosure, an image sensor includes a substrate, a first grid pattern disposed on the substrate and including a first side wall and a second side wall opposite to the first side wall, a first pixel including a first photoelectric conversion element and a first color filter, and a second pixel including a second photoelectric conversion element and a second color filter. The first color filter contacts the first side wall, the second color filter contacts the second side wall, the first photoelectric conversion element and the second photoelectric conversion element are disposed inside the substrate, the first color filter and the second color filter are disposed on the substrate, the first color filter and the second color filter are color filters of same color, and the first color filter has a convex shape, and the second color filter has a concave shape.

According to embodiments of the present disclosure, an image sensor includes a substrate, a first pixel including a first photoelectric conversion element disposed inside the substrate and a first color filter disposed on the substrate, a second pixel including a second photoelectric conversion element disposed inside the substrate and a second color filter disposed on the substrate; and a third pixel disposed between the first pixel and the second pixel, and including a third photoelectric conversion element disposed inside the substrate and a third color filter disposed on the substrate. The second color filter does not contact the first color filter, the second color filter and the third color filter are color filters of same color, the first color filter is a color filter of a color different from the second color filter and the third color filter, and a first thickness of the third color filter is greater than a second thickness of the second color filter.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

Figure 1:
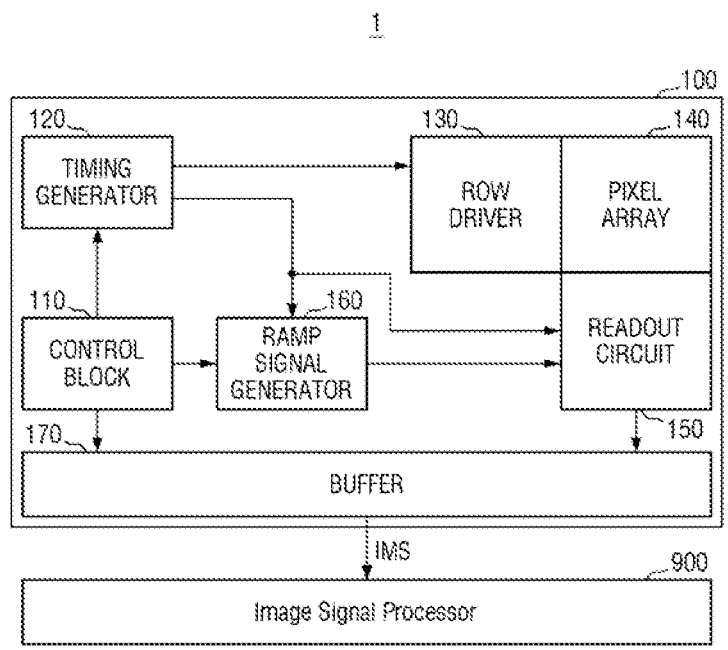
FIG. 1 is a block diagram of an image sensing device according to some embodiments.

Hereinafter, embodiments of the present disclosure will be described with reference to the accompanying drawings. Like reference symbols in the drawings may denote like elements, and to the extent that a description of an element has been omitted, it may be understood that the element is at least similar to corresponding elements that are described elsewhere in the specification.

FIG. 1 is a block diagram of an image sensing device according to some embodiments.

Referring to FIG. 1, the image sensing device 1 may include an image sensor 100 and an image signal processor 900.

The image sensor 100 may generate an image signal IMS by sensing an image from incident light. In some embodiments, although the generated image signal IMS may be, for example, a digital signal, the embodiment according to the technical ideas of the present disclosure is not necessarily limited thereto.

The image signal IMS may be provided to the image signal processor 900 and processed therein. In an example operation, the image signal processor 900 receives the image signal IMS that is output from a buffer 170 of the image sensor 100, and may process or treat the received image signal IMS to allow an image to be displayed.

In some embodiments, the image signal processor 900 may perform digital binning on the image signal IMS that is output from the image sensor 100. For example, the image signal IMS that is output from the image sensor 100 may be a raw image signal from the pixel array 140 without analog binning, or the image signal IMS may be an image signal on which analog binning has already been performed.

In some embodiments, the image sensor 100 and the image signal processor 900 may be placed separately as shown. For example, the image sensor 100 is mounted on a first chip and the image signal processor 900 is mounted on a second chip that is configured to communicate to the first chip through an interface. However, the embodiments are not necessarily limited thereto, and the image sensor 100 and the image signal processor 900 may be implemented as a single package, for example, an MCP (multi chip package).

The image sensor 100 may include a control register block 110, a timing generator 120, a row driver 130, a pixel array 140, a readout circuit 150, a ramp signal generator 160, and a buffer 170.

The control register block 110 may generally control the operation of the image sensor 100. For example, the control register block 110 may directly transmit an operation signal to the timing generator 120, the ramp signal generator 160 and the buffer 170.

The timing generator 120 may generate a signal that serves as a reference for the operation timing of a plurality of components of the image sensor 100. The operation timing reference signal generated by the timing generator 120 may be sent to the row driver 130, the readout circuit 150, the ramp signal generator 160, and/or other components of the image sensor.

The ramp signal generator 160 may generate and transmit the ramp signal used in the readout circuit 150. For example, the readout circuit 150 may include a correlated double sampler (CDS), a comparator, and/or the like. The ramp signal generator 160 may generate and transmit the ramp signal used in the correlated double sampler, the comparator, and/or the like.

The buffer 170 may include, for example, a latch. The buffer 170 may temporarily store the image signal IMS, and may transmit the image signal IMS to an external memory or an external device.

The pixel array 140 may sense external images. For example, the pixel array 140 may sense an image of an external environment, where the image corresponds to light incident on the pixel array 140. The pixel array 140 may include multiple pixels (or unit pixels). The row driver 130 may selectively activate a row of the pixel array 140.

The readout circuit 150 may sample the pixel signal provided from the pixel array 140, compare the pixel signal to the ramp signal, and convert an analog image signal (data) into a digital image signal (data) based on the comparison.

Figure 2:
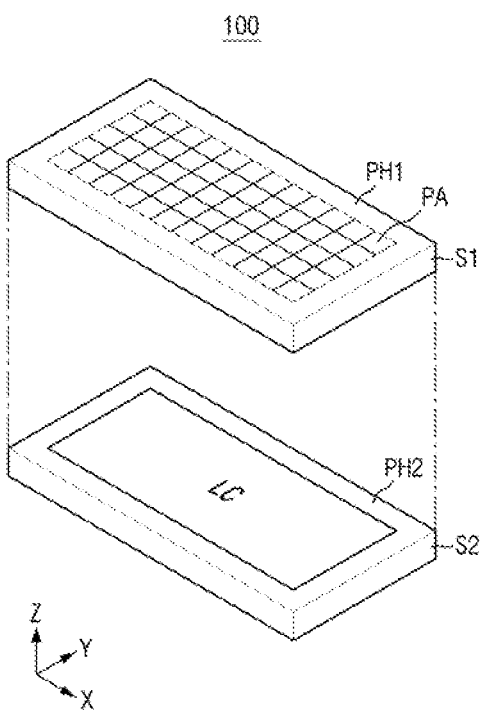
FIG. 2 is a diagram that shows a conceptual layout of the image sensor of FIG. 1.

FIG. 2 is a diagram that shows a conceptual layout of the image sensor of FIG. 1.

Referring to FIG. 2, the image sensor 100 may include first and second regions S1 and S2 stacked in a third direction Z. The first and second regions S1 and S2 may extend in the first direction X and a second direction Y as shown, and blocks (e.g., the components) shown in FIG. 1 may be placed in the first and second regions S1 and S2.

A third region in which a memory is placed may be placed below the second region S2. The memory placed in the third region may receive the image data from the first and second regions S1 and S2, store or process the image data, and may send the image data to the first and second regions S1 and S2 again. The memory may include a memory element such as a DRAM (dynamic random access memory) element, a SRAM (static random access memory) element, a STT-MRAM (spin transfer torque magnetic random access memory) element, and/or a flash memory element. When the memory includes, for example, a DRAM element, image data may be received and processed at a relatively high speed. Also, in some embodiments, the memory may also be placed in the second region S2.

The first region S1 may include the pixel array region PA and a first peripheral region PH1, and the second region S2 may include a logic circuit region LC and a second peripheral region PH2. The first and second regions S1 and S2 may be sequentially stacked one above the other. For example, the first and second regions S1 and S2 may be stacked such that they overlap each other in the third "Z" direction.

In the first region S1, the pixel array region PA may contain the pixel array (140 of FIG. 1) described from FIG. 1. The pixel array region PA may include multiple unit pixels arranged in a matrix form. Each pixel may include photodiodes and transistors. A more specific description thereof will be provided later.

The first peripheral region PH1 may include a plurality of pads, and may be disposed around the pixel array region PA. The plurality of pads may transmit and receive electrical signals to and from an external device or the like.

In the second region S2, the logic circuit region LC may include electronic elements including a plurality of transistors. The electronic elements included in the logic circuit region LC are electrically connected to the pixel array region PA, and may provide a constant signal to each unit pixel PX of the pixel array region PA and/or control the output signal.

For example, the control register block 110, the timing generator 120, the row driver 130, the readout circuit 150, the ramp signal generator 160, the buffer 170, and the like described above referring to FIG. 1 may be placed in the logic circuit region LC. For example, among the blocks of FIG. 1, blocks other than the pixel array 140 may be placed in the logic circuit region LC.

Although the second peripheral region PH2 may be placed in a region of the second region S2 that corresponds to (for example, vertically overlaps with) the first peripheral region PH1 of the first region S1, the embodiments are not necessarily limited thereto.

Figure 3:
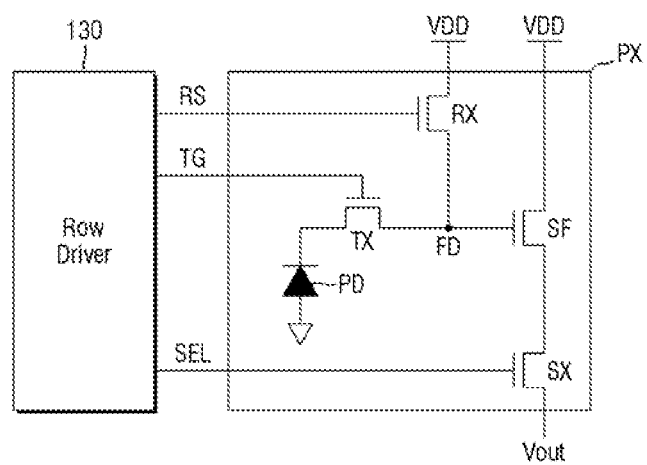
FIG. 3 is a circuit diagram of the pixel according to some embodiments.

FIG. 3 is a circuit diagram of the pixel according to some embodiments.

Referring to FIG. 3, the pixel PX may include a photo diode PD, a transfer transistor TX, a reset transistor RX, a source follower SF, and a selection transistor SX. Here, the pixel PX may be a unit pixel that is included the pixel array 140 or the pixel array region PA.

In an embodiment, one end of the transfer transistor TX is connected to the photodiode PD, the other end is connected to a floating diffusion region FD, and a control electrode may receive the control signal TG.

In an embodiment, one end of the reset transistor RX receives a power supply voltage VDD, the other end is connected to the floating diffusion region FD, and the control electrode may receive the control signal RS. One end of the source follower SF receives the power supply voltage VDD, the other end is connected to one end of the selection transistor SX, and the control electrode may be connected to the floating diffusion region FD. The other end of the selection transistor SX is connected to a column line CL, and the control electrode may receive the control signal SEL.

Each of the control signals TG, RS, and SEL which are capable of controlling each of the transistors TX, RX, and SX may be output from the row driver 130. An output signal Vout of the selection transistor SX may be supplied to the column line. The output signal Vout may correspond to an analog signal. For example, the output signal Vout that is output from the pixel PX may be converted into a digital signal through the readout circuit 150, and sent to the image signal processor 900 as the image signal IMS.

Figure 4:
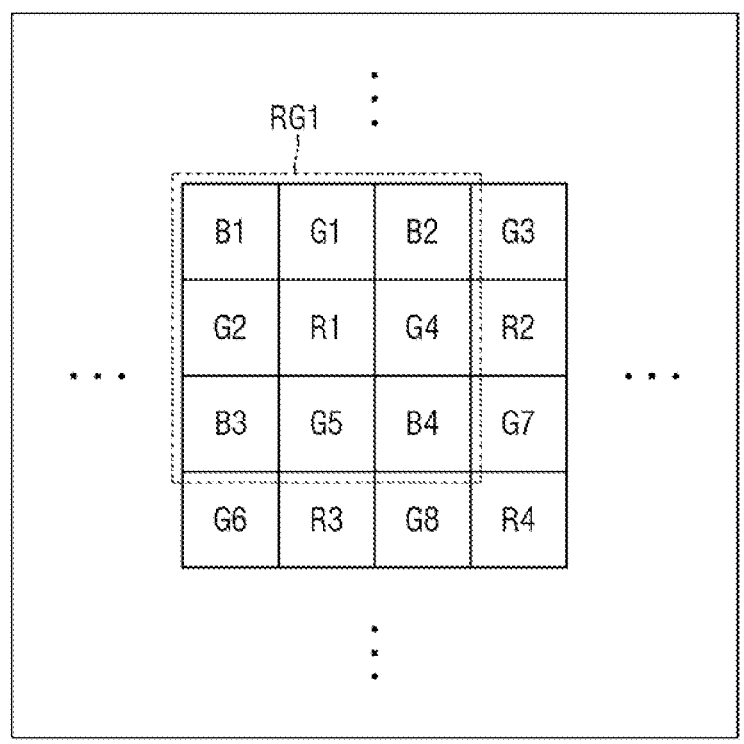
FIG. 4 is a diagram of a pixel array according to some embodiments.
Figure 5:
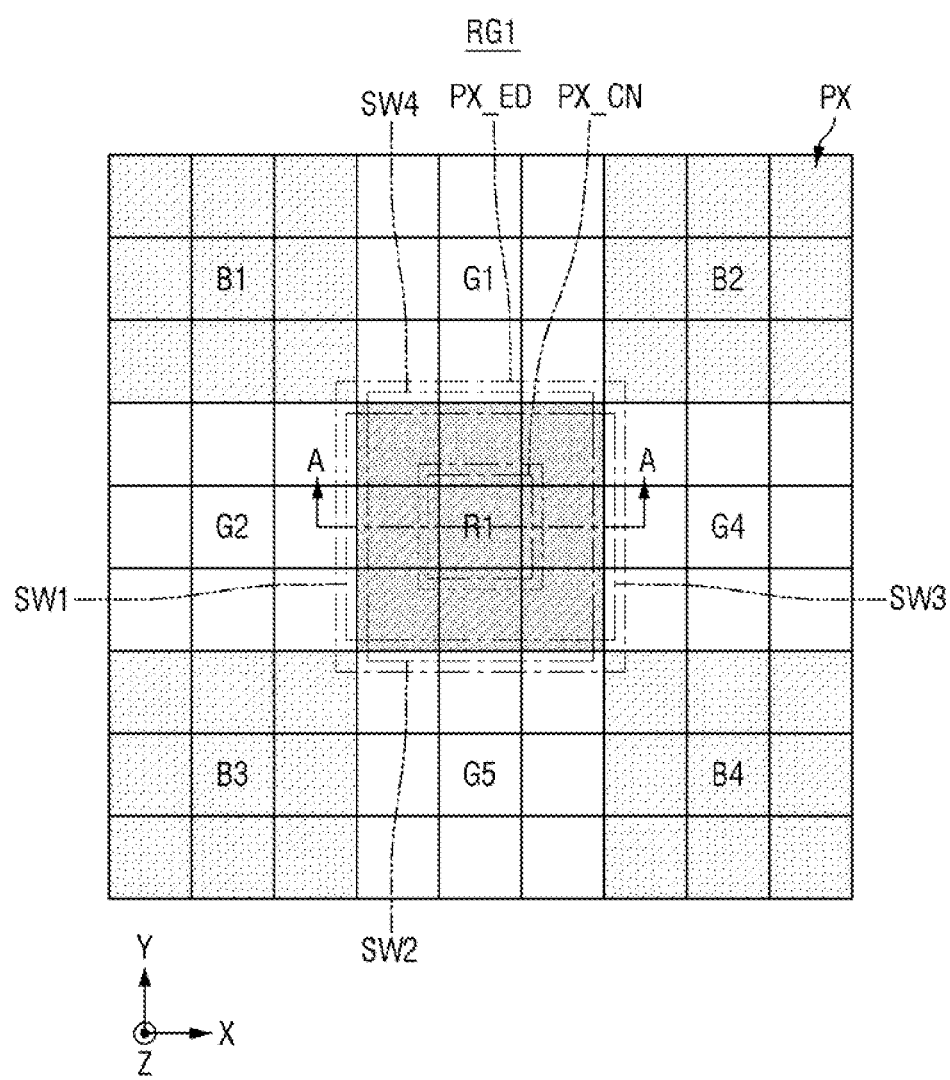
FIG. 5 is an enlarged view of a RG1 region of FIG. 4.
Figure 6:
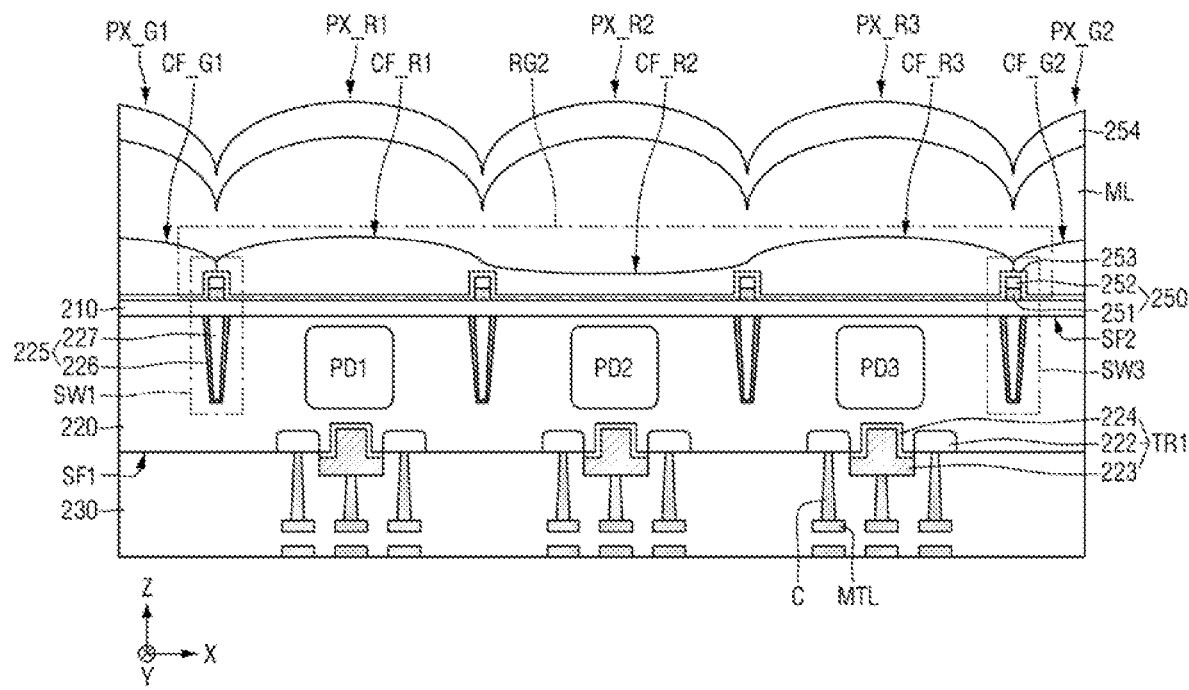
FIG. 6 is a cross-sectional view of a pixel array taken along A-A of FIG. 5.

FIG. 4 is a diagram of a pixel array according to some embodiments. FIG. 5 is an enlarged view of a RG1 region of FIG. 4. FIG. 6 is a cross-sectional view of a pixel array taken along A-A of FIG. 5.

Referring to FIG. 4, the first pixel array region PA1 may include a plurality of pixel groups. For example, the first pixel array region PA1 may correspond to the pixel array 140 and the pixel array region PA of FIGS. 1 to 3.

The first pixel array region PA1 may be arranged in an RGB pattern. For example, a first pixel array region PA1 may include first to fourth red pixel groups R1 to R4, first to fourth blue pixel groups B1 to B4, and first eighth green pixels G1 to G8 arranged in a particular pattern. For example, the first to fourth red pixel groups R1 to R4 may be surrounded by the first to eighth green pixel groups G1 to G8, and the first to fourth blue pixels groups B1 to B4 may be surrounded by the first to eighth green pixel groups G1 to G8. The first pixel array region PA1 may extend in the first direction X and the second direction Y, and may include a pixel group arranged regularly in the first direction X and the second direction Y. For example, the pixels may be arranged at regular intervals in the first direction X, and may be arranged at regular intervals in the second direction Y.

Referring to FIG. 5, the RG1 region of the first pixel array region PA1 may include a pixel group arranged in an RGB nona pattern. For example, the RG1 region of the first pixel array region PA1 may include a first red pixel group R1, first to fourth green pixel groups B1 to B4, a first green pixel group G1, a second green pixel group G2, a fourth green pixel group G4, and a fifth green pixel group G5. Here, each pixel group may include a plurality of pixels PX. For example, the first red pixel group R1 may include nine pixels PX. In this case, where one pixel group includes nine pixels PX, the first pixel array region PA1 may correspond to the RGB nona pattern. However, the embodiments of the present disclosure are not necessarily limited thereto, and the first pixel array region PA1 may be an RGB tetra pattern or an RGB hexadeca pattern. For example, in some embodiments, one pixel group may include four pixels PX or sixteen pixels PX.

The pixels PX of the first red pixel group R1 may be arranged in a 3×3 pattern. For example, in the first red pixel group R1, three pixels PX may be arranged in a row which extends in the first direction X, and three rows may be arranged in the second direction Y. The first red pixel group R1 may include an edge pixel PX_ED and a center pixel PX_CN. For example, the center pixel PX_CN is located at the center of the first red pixel group R1, and may not be in contact with other types of pixel groups (e.g., the center pixel PX_CN may not contact pixel groups of colors other than red). Also, the center pixel PX_CN may be surrounded by the edge pixels PX_ED. For example, the edge pixel PX_ED may be in contact with other types of pixel group, and may surround the center pixel PX_CN. Although the first red pixel group R1 has been described as an example in this drawing, the embodiment of the present disclosure is not necessarily limited thereto, and other pixel groups (for example, a blue pixel group or a green pixel group) may also have a center pixel PX_CN and an edge pixel PX_ED.

The first red pixel group R1 may include multiple side walls. A plurality of side walls may define the first red pixel group R1. For example, the first red pixel group R1 may include a first side wall through a fourth side wall SW1 to SW4. The first side wall SW1 may be disposed between the first red pixel group R1 and the second green pixel group G2, and may extend in the second direction Y. The second side wall SW2 may be disposed between the first red pixel group R1 and the fifth green pixel group G5, and may extend in the first direction X. Further, the second side wall SW2 may intersect the first side wall SW1. The third side wall SW3 may be disposed between the first red pixel group R1 and the fourth green pixel group G4, and may extend in the second direction Y. Further, the third side wall SW3 may intersect the second side wall SW2. The fourth side wall SW4 may be disposed between the first red pixel group R1 and the first green pixel group G1, and may extend in the first direction X. Further, the fourth side wall SW4 may intersect the first side wall SW1 and the third side wall SW3. Each of the side walls may define a boundary between pixel groups.

Referring to FIG. 6, the pixels PX may include a first green pixel PX_G1, a first red pixel PX_R1, a second red pixel PX_R2, a third red pixel PX_R3, a second green pixel PX_G2. The first green pixel PX_G1, the first red pixel PX_R1, the second red pixel PX_R2, the third red pixel PX_R3 and the second green pixel PX_G2 may be arranged sequentially along the first direction X. For example, the first green pixel PX_G1, the first red pixel PX_R1, the second red pixel PX_R2, the third red pixel PX_R3, and the second green pixel PX_G2 may be arranged continuously. The pixels may have a similar structure, and the pixels will be described below by taking the first red pixel PX_R1 as an example.

The first red pixel PX_R1 may include a semiconductor substrate 220, a first photoelectric conversion layer PD1, a transistor TR1, a pixel separation pattern 225, and the like.

The semiconductor substrate 220 may be, for example, bulk silicon or SOI (silicon-on-insulator). The semiconductor substrate 220 may be a silicon substrate and/or may include other substances, for example, silicon germanium, indium antimonide, lead tellurium compounds, indium arsenic, indium phosphide, gallium arsenide or gallium antimonide. Additionally or alternatively, the semiconductor substrate 220 may have an epitaxial layer formed on a base substrate. The semiconductor substrate 220 may include a first surface SF1 and a second surface SF2 that are opposite to each other. In some embodiments, the second surface SF2 of the semiconductor substrate 220 may be a light-receiving surface on which light is incident. As described herein, the first surface SF1 may be a front surface of the semiconductor substrate 220, and the second surface SF2 may be a back surface of the semiconductor substrate 220.

In some embodiments, a transistor TR1 may be placed on the first surface SF1 of the semiconductor substrate 220. The transistor TR1 may include, for example, at least a part of various transistors (e.g., a transfer transistor, a reset transistor, a source follower transistor, a selection transistor, and the like) that make up the unit pixel of the image sensor.

The transistor TR1 may include a gate insulating film 222, a gate electrode 223, and an impurity injection region 224. The gate insulating film 222 may be formed along a trench formed in the semiconductor substrate 220. The gate electrode 223 may be disposed in a region defined by the gate insulating film 222. For example, the gate electrode may be disposed between two gate insulating films 222. The impurity injection region 224 may be formed by doping the semiconductor substrate 220 with impurities. Here, the gate electrode 223 may act as a gate of the transistor TR1, and the impurity injection region 224 may act as a source/drain of the transistor TR1. Further, the impurity injection region 224 may correspond to, for example, a floating diffusion.

The pixel separation pattern 225 may be placed inside the semiconductor substrate 220. The pixel separation pattern 225 may define a plurality of unit pixels. The unit pixels may be arranged two-dimensionally from a planar viewpoint. For example, the pixel separation pattern 225 may be formed in a grid pattern from a planar viewpoint to separate unit pixels from each other. The pixel separation pattern 225 may be formed by burying an insulating material in a deep trench formed by patterning a semiconductor substrate 220.

In some embodiments, the pixel separation pattern 225 may include an insulating spacer film 226 and a conductive filling pattern 227. The insulating spacer film 226 may conformally extend along the side surfaces of the deep trench formed by the patterning of the semiconductor substrate 220. The conductive filling pattern 227 may be formed on the insulating spacer film 226 to fill a part of the trench in the semiconductor substrate 220.

The first red pixel PX_R1 may include a first photoelectric conversion layer PD1. The first photoelectric conversion layer PD1 may be formed in the semiconductor substrate 220. The first photoelectric conversion layer PD1 may generate an electric charge in proportion to an amount of light that is incident from the outside. The first photoelectric conversion layer PD1 may be formed by, for example, doping impurities in the semiconductor substrate 220. For example, when the semiconductor substrate 220 is doped with a p-type impurity, the first photoelectric conversion layer PD1 may be doped with an n-type impurity. For example, the type of impurities doped in the semiconductor substrate 220 may differ from the type of impurities doped in the first photoelectric conversion layer PD1.

In some embodiments, the first red pixel PX_R1 may include a surface insulating layer 210, a grid pattern 250, a first liner 253, a first red color filter CF_R1, a microlens ML, and a second liner 254.

The second red pixel PX_R2 may include a second red color filter CF_R2, the third red pixel PX_R3 may include a third red color filter CF_R3, the first green pixel PX_G1 may include a first green color filter CF_G1, and the second green pixel PX_G2 may include a second green color filter CF_G2. Although the respective pixels may include color filters different from each other, the embodiments of the present disclosure are not necessarily limited thereto.

The first red color filter CF_R1, the second red color filter CF_R2, and the third red color filter CF_R3 may be color filters of the same color. For example, the image signal sensed by the pixels through the first red color filter CF_R1, the second red color filter CF_R2, and the third red color filter CF_R3 may include data about a sensed red color. For example, the first red color filter CF_R1, the second red color filter CF_R2, and the third red color filter CF_R3 may each filter incident light by each allowing a certain band of wavelength to pass through (e.g., the same band of wavelengths). The first green color filter CF_G1 and the second green color filter CF_G2 may be color filters of the same color. For example, the image signal sensed by the pixels through the first green color filter CF_G1 and the second green color filter CF_G2 may include data about a sensed green color.

The surface insulating layer 210 may be stacked on the second surface SF2 of the semiconductor substrate 220. A grid pattern 250, a first liner 253, a color filter CF, a microlens ML and a second liner 254 may be placed in a region defined by the surface insulating layer 210.

The grid pattern 250 may be formed to correspond to the pixel separation pattern 225. For example, the grid pattern 250 may overlap the pixel separation pattern 225. The grid pattern 250 may be formed in a lattice form on the surface insulating layer 210 from a planar viewpoint. For example, the grid pattern 250 may define the unit pixels. For example, the grid pattern 250 may be formed at the boundary between the pixels PX. The grid pattern 250 may be formed between the color filters.

The grid pattern 250 and the pixel separation pattern 225 may correspond to a plurality of side walls SW1 to SW4. For example, the first side wall SW1 may include a grid pattern 250 and a pixel separation pattern 225 formed between the first red pixel PX_R1 and the first green pixel PX_G1. Further, the third side wall SW3 may include a grid pattern 250 and a pixel separation pattern 225 formed between the third red pixel PX_R3 and the second green pixel PX_G2.

The grid pattern 250 may include, for example, a metal pattern 251 and a low refractive index pattern 252. The metal pattern 251 and the low refractive index pattern 252 may be sequentially stacked on the surface insulating layer 210. The first liner 253 may be formed on the surface insulating layer 210 and the grid pattern 250. The first liner 253 may extend along the surfaces of the surface insulating layer 210 and the grid pattern 250. The first liner 253 may include, but is not necessarily limited to, for example, aluminum oxide.

The color filters may be formed in the region defined by the grid pattern 250. For example, the color filters may be formed on the first liner 253 of the region defined by the pixel PX. The first red color filter CF_R1 may be formed in the region defined by the grid pattern 250 on the first photoelectric conversion layer PD1. The first red color filter CF_R1 may cover a part of the grid pattern 250. The second red color filter CF_R2 may be formed in the region defined by the grid pattern 250 on the second photoelectric conversion layer PD2. The second red color filter CF_R2 may cover a part of the grid pattern 250. The third red color filter CF_R3 may be formed in the region defined by the grid pattern 250 on the third photoelectric conversion layer PD3. The third red color filter CF_R3 may cover a part of the grid pattern 250. The first to third red color filters CF_R1, CF_R2 and CF_R3 may include a negative photoresist. Here, although all the first to third red color filters CF_R1, CF_R2 and CF_R3 may be connected, the embodiment of the present disclosure is not necessarily limited thereto. A more detailed description of the color filter will be provided later.

A microlens ML may be formed on the color filter. The microlens ML may be arranged to correspond to each unit pixel PX. The microlens ML has a convex shape, and may have a predetermined radius of curvature. As a result, the microlens ML may concentrate the light that is incident on the photoelectric conversion layers PD1, PD2 and PD3. The microlens ML may include, but is not necessarily limited to, for example, a light-transmitting resin. Here, the microlens ML of each pixel PX may cover one surface of each pixel PX.

The second liner 254 may extend along the surface of the microlens ML. The second liner 254 may include, but is not necessarily limited to, for example, an inorganic oxide film (e.g., silicon oxide, titanium oxide, zirconium oxide, hafnium oxide, and combinations thereof).

In some embodiments, the first red pixel PX_R1 may include an inter-wiring insulating layer 230, a connection structure, and the like. The connection structure may be formed in the inter-wiring insulating layer 230. Here, the connection structure may include a plurality of metal layers MTL, a plurality of contacts C, and the like. The configurations of the pixel PX and the configurations of the image sensor 100 may be electrically connected through the connection structure.

Hereinafter, the first pixel array region PA1 of the image sensor 100 will be described in more detail referring to FIG. 7.

Figure 7:
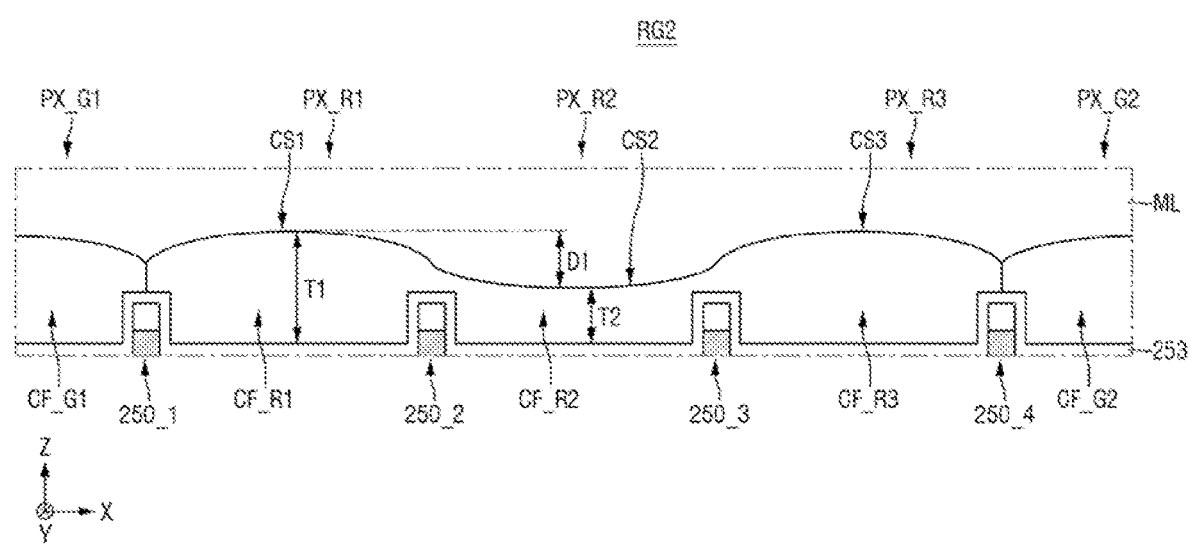
FIG. 7 is an enlarged view of a RG2 region of FIG. 6 according to some embodiments.

FIG. 7 is an enlarged view of a RG2 region of FIG. 6 according to some embodiments.

Referring to FIG. 7, the first red pixel PX_R1 may include a first red color filter CF_R1, the second red pixel PX_R2 may include a second red color filter CF_R2, and the third red pixel PX_R3 may include a third red color filter CF_R3. Further, the first green pixel PX_G1 may include a first green color filter CF_G1, and the second green pixel PX_G2 may include a second green color filter CF_G2. Also, the first green color filter CF_G1, the first red color filter CF_R1, the second red color filter CF_R2, the third red color filter CF_R3, and the second green color filter CF_G2 may be arranged in order and may be brought into contact with each other. For example, the first green color filter CF_G1 may contact the first red color filter CF_R1, the first red color filter CF_R1 may contact the second red color filter CF_R2, the second red color filter CF_R2 may contact the third red color filter CF_R3, and the third red color filter CF_R3 may contact the second green color filter CF_G2.

The first green color filter CF_G1, the first red color filter CF_R1, the second red color filter CF_R2, the third red color filter CF_R3, and the second green color filter CF_G2 may be placed with the grid pattern 250 as a boundary. For example, the first grid pattern 250_1 may be placed between the first green color filter CF_G1 and the first red color filter CF_R1, and the second grid pattern 250_2 may be placed between the first red color filter CF_R1 and the second red color filter CF_R2. Further, the third grid pattern 250_3 may be placed between the second red color filter CF_R2 and the third red color filter CF_R3, and the fourth grid pattern 250_4 may be placed between the third red color filter CF_R3 and the second green color filter CF_G2. Each color filter may be brought into contact with a part of each grid pattern 250, for example, the side wall and the upper surface of the grid pattern 250.

An upper surface of the first red color filter CF_R1 may be a first curved surface CS1, and the first curved surface CS1 may have a convex shape. For example, the first curved surface CS1 may have a convex shape which bulges upwards in the third direction Z. An upper surface of the second red color filter CF_R2 may be a second curved surface CS2, and the second curved surface CS2 may have a concave shape. For example, the second curved surface CS2 may have a concave shape unlike the first curved surface CS1. For example, the second curved surface CS2 may recess downwards in the third direction Z. An upper surface of the third red color filter CF_R3 may be a third curved surface CS3, and the third curved surface CS3 may have a convex shape.

A first thickness T1 of the first red color filter CF_R1 may be a distance from the upper surface of the first liner 253 to the first curved surface CS1, and a second thickness T2 of the second red color filter CF_R2 may be a distance from the upper surface of the first liner 253 to the second curved surface CS2. For example, the first thickness T1 may be a distance from the upper surface of the first liner 253 to a center of the first curved surface CS1, and the second thickness T2 of the second red color filter CF_R2 may be a distance from the upper surface of the first liner 253 to the center of second curved surface CS2. The first thickness T1 of the first red color filter CF_R1 may be greater than the second thickness T2 of the second red color filter CF_R2. For example, the first thickness Ti may be greater than the second thickness T2 by a first distance D1. Also, a thickness of the third red color filter CF_R3 may be greater than the second thickness T2.

Referring to FIGS. 4 to 7, the first red pixel PX_R1 and the third red pixel PX_R3 each corresponding to the edge pixel PX_ED may be disposed adjacent to other pixel groups. Accordingly, sensitivity of the image signals that are output from the first red pixel PX_R1 and the third red pixel PX_R3 each corresponding to the edge pixel PX_ED may be relatively greater as a result of crosstalk from other pixel groups. By contrast, the second red pixel PX_R2 corresponding to the center pixel PX_CN may not be disposed adjacent to or in contact with other pixel groups (for example, the second green pixel group G2). Accordingly, the second red pixel PX_R2 may have less crosstalk from surrounding pixel PX. As a result, the sensitivity of the image signal that is output from the second red pixel PX_R2 may be relatively smaller.

Referring to FIGS. 6 and 7, because the second thickness T2 of the second red color filter CF_R2 of the second red pixel PX_R2 is less than the first thickness Ti of the first red color filter CF_R1 of the first red pixel PX_R1, the sensing sensitivity of the second red pixel PX_R2 may be further increased. For example, because the second thickness T2 of the second red color filter CF_R2 is less than the first thickness T1 of the first red color filter CF_R1, a relatively larger amount of light may reach the second red pixel PX_R2. Accordingly, the sensing sensitivity of the second red pixel PX_R2 may become the same as the sensing sensitivity of the first red pixel PX_R1 and the third red pixel PX_R3. Accordingly, the image quality of the image signal IMS that is output from the image sensor 100 including the first pixel array region PA1 may be further increased.

Referring to FIG. 6 again, in some embodiments, the thickness of the microlens ML on the first red color filter CF_R1 may be less than the thickness of the microlens ML on the second red color filter CF_R2. Also, the thickness of the microlens ML on the third red color filter CF_R3 may be smaller than the thickness of the microlens ML on the second red color filter CF_R2.

Figure 8:
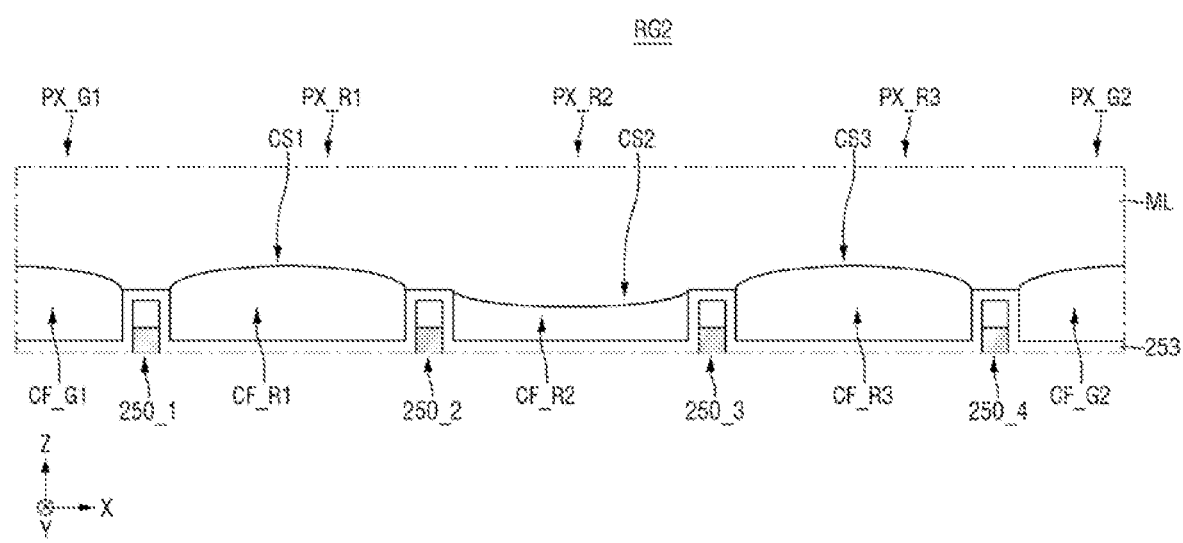
FIG. 8 is an enlarged view of the RG2 region of FIG. 6 according to some embodiments.

FIG. 8 is an enlarged view of the RG2 region of FIG. 6 according to some embodiments.

Referring to FIG. 8, unlike the first pixel array region PA1 of FIG. 7, the upper surfaces of each grid pattern 250 may be exposed. In this case, the upper surface of the grid pattern 250 may come into direct contact with the microlens ML. For example, the upper surfaces of the first to fourth grid patterns 250_1, 250_2, 250_3 and 250_4 may be in direct contact with the microlens ML.

One side surface of the first grid pattern 250_1 may be in contact with the first green color filter CF_G1, and the other side surface of the first grid pattern 250_1 may be in contact with the first red color filter CF_R1. In the embodiment illustrated in FIG. 8, the first green color filter CF_G1 and the first red color filter CF_R1 may not cover the upper surface of the first grid pattern 250_1.

One side surface of the second grid pattern 250_2 may be in contact with the first red color filter CF_R1, and the other side surface of the second grid pattern 250_2 may be in contact with the second red color filter CF_R2. In the embodiment illustrated in FIG. 8, the first red color filter CF_R1 and the second red color filter CF_R2 may not cover the upper surface of the second grid pattern 250_2.

One side surface of the third grid pattern 250_3 may be in contact with the second red color filter CF_R2, and the other side surface of the third grid pattern 250_3 may be in contact with the third red color filter CF_R3. In the embodiment illustrated in FIG. 8, the second red color filter CF_R2 and the third red color filter CF_R3 may not cover the upper surface of the third grid pattern 250_3.

One side surface of the fourth grid pattern 250_4 may be in contact with the third red color filter CF_R3, and the other side surface of the fourth grid pattern 250_4 may be in contact with the second green color filter CF_G2. In the embodiment illustrated in FIG. 8, the third red color filter CF_R3 and the second green color filter CF_G2 may not cover the upper surface of the fourth grid pattern 250_4.

At this time, the first curved surface CS1 of the first red color filter CF_R1 and the third curved surface CS3 of the third red color filter CF_R3 may have a convex shape, and the second curved surface CS2 of the second red color filter CF_R2 may have a concave shape. The first to third curved surfaces CS1 to CS3 may be formed by a photolithography process.

Hereinafter, a method of fabricating the image sensor 100 including the first pixel array region PA1 will be described referring to FIGS. 9 to 14.

FIGS. 9 to 14 are diagrams that illustrate a method of fabricating the image sensor according to some embodiments. For convenience of explanation, repeated description of components from FIGS. 1 to 8 will be briefly explained or omitted.

Figure 9:
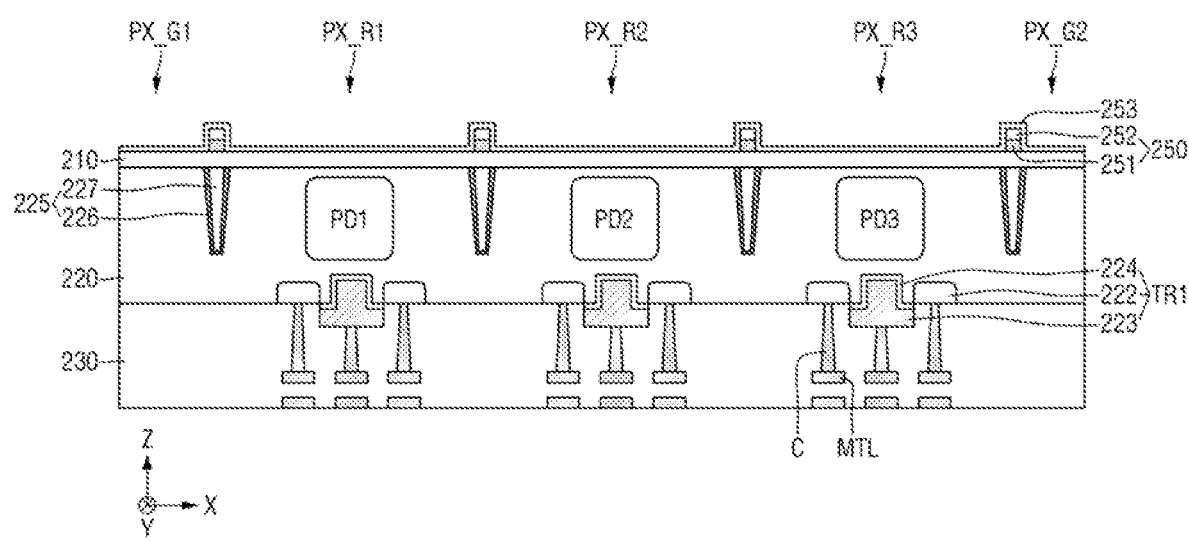
FIGS. 9 to 14 are diagrams that illustrate a method of fabricating the image sensor according to some embodiments.

Referring to FIG. 9, a first pixel array region PA1 that includes a semiconductor substrate 220, an inter-wiring insulating layer 230, first to third photoelectric conversion layers PD1 to PD3, a transistor TR1, a metal layer MTL, a contact C, a pixel separation pattern 225, a surface insulating layer 210, a grid pattern 250, a first liner 253, and the like may be formed. The image sensor 100 including the first pixel array region PA1 may be fabricated by a known technique. Each of the pixels PX_G1, PX_R1, PX_R2, PX_R3 and PX_G2 may be defined by the grid pattern 250.

Figure 10:
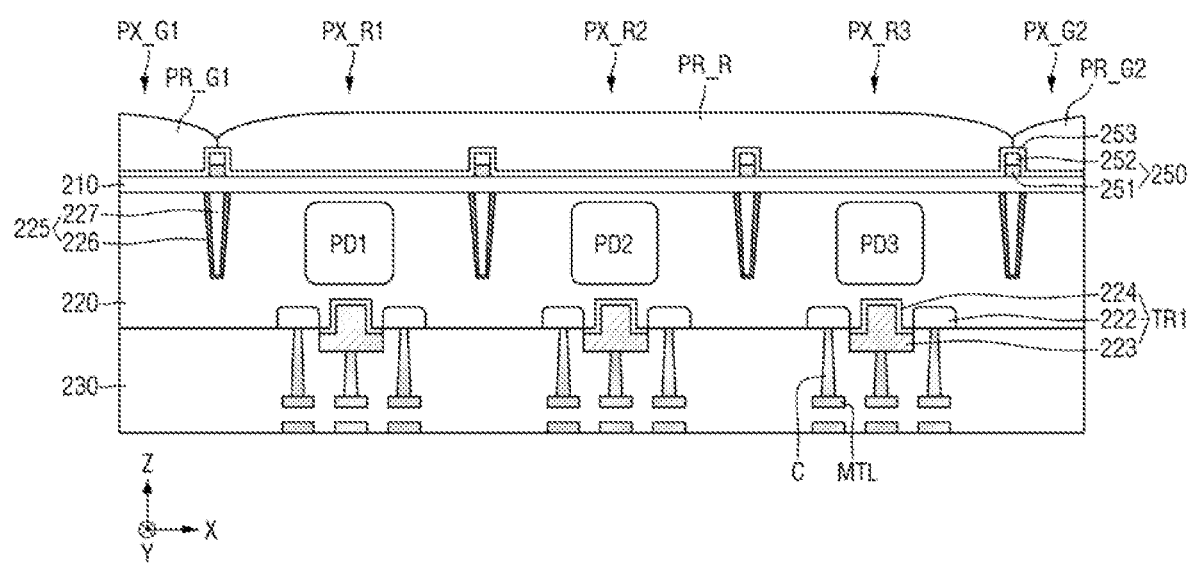

Referring to FIG. 10, photoresists PR_R, PR_G1 and PR_G2 may be formed on the grid pattern 250 and the first liner 253. For example, the red photoresist PR_R may be formed on the region corresponding to the first red pixel group R1. For example, the red photoresist PR_R may be formed on the first liner 253 corresponding to the first red pixel PX_R1, the second red pixel PX_R2 and the third red pixel PX_R3. Here, the red photoresist PR_R may cover the grid pattern 250.

Further, the green photoresist PR_G1 may be formed on a region corresponding to the second green pixel group G2. For example, the green photoresist PR_G1 may be formed on the first liner 253 corresponding to the first green pixel PX_G1. The green photoresist PR_G2 may be formed on the region corresponding to the fourth green pixel group G4. For example, the green photoresist PR_G2 may be formed on the first liner 253 corresponding to the second green pixel PX_G2. Here, the green photoresists PR_G1 and PR_G2 may cover the grid pattern 250.

The photoresists PR_R, PR_G1 and PR_G2 may be negative photoresists. For example, when light is incident on the photoresists PR_R, PR_G1 and PR_G2, the photoresists PR_R, PR_G1 and PR_G2 that have absorbed the light may be cured. After the development is performed, only the cured portions of the photoresists PR_R, PR_G1 and PR_G2 may remain.

Figure 11:
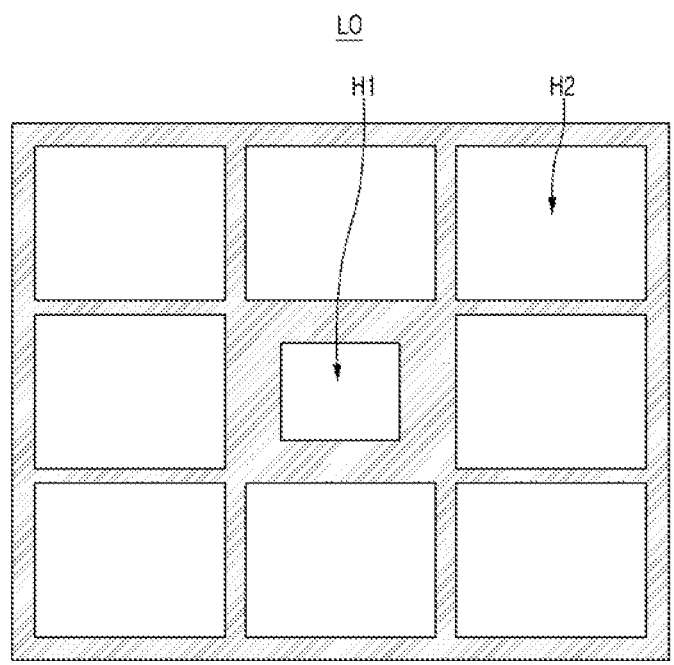
Figure 12:
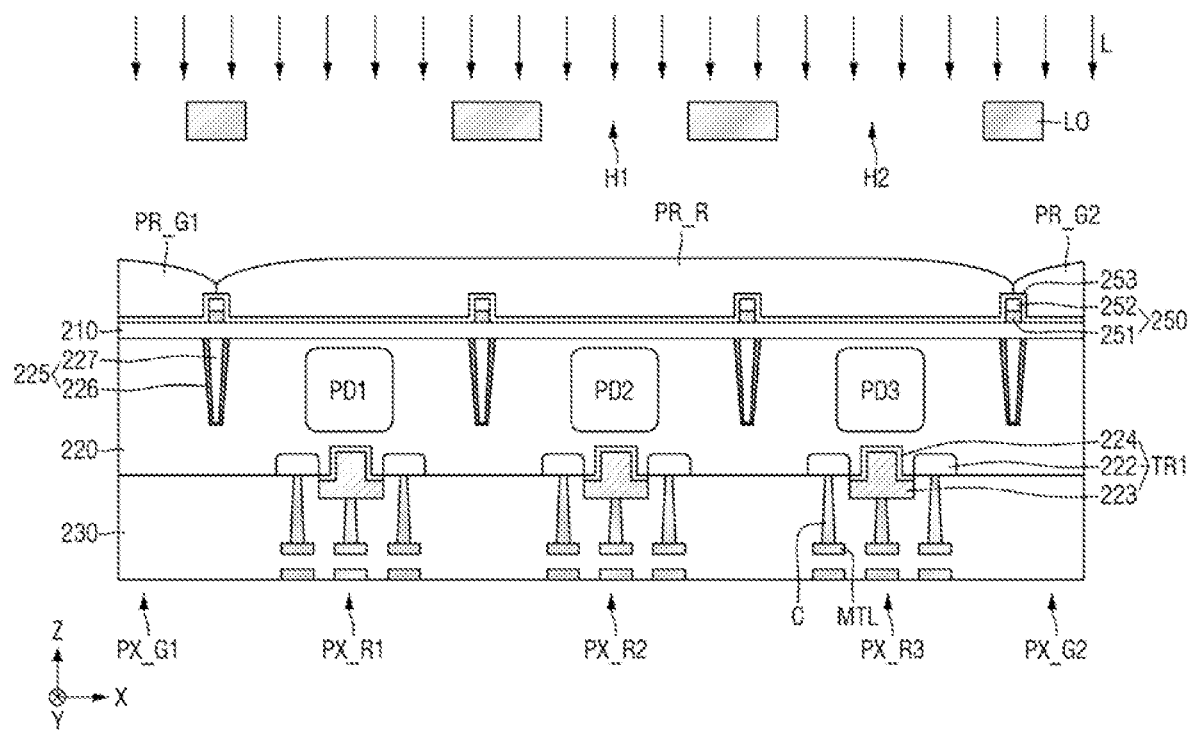

Referring to FIGS. 11 and 12, a photolithography process using a layout LO may be performed. Here, the layout LO may include a first hole H1 and a second hole H2. The first hole H1 and the second hole H2 may be portions through which the incident light L passes. The incident light L that has passed through the first hole H1 and the second hole H2 of the layout LO may be incident on the photoresists PR_R, PR_G1 and PR_G2.

The first hole H1 of the layout LO may be placed to correspond to the second red pixel PX_R2, and the second hole H2 of the layout LO may be placed to correspond to the first red pixel PX_R1 and the third red pixel PX_R3. For example, the first hole H1 of the layout LO may correspond to the center pixel PX_CN, and the second hole H2 of the layout LO may correspond to the edge pixel(s) PX_ED (in this embodiment, 8 edge pixels PX_ED surround the center pixel PX_CEN). The size of the first hole H1 may be smaller than the size of the second hole H2. For example, the amount of incident light L passing through the first hole H1 may be smaller than the amount of incident light L passing through the second hole H2. Accordingly, the cured amount of the red photoresist PR_R of the second red pixel PX_R2 that absorbs the incident light L passing through the first hole H1 may be less than the cured amounts of the red photoresist PR_R of the first red pixel PX_R1 and the third red pixel PX_R3, which absorb the incident light L passing through the second hole H2.

Figure 13:
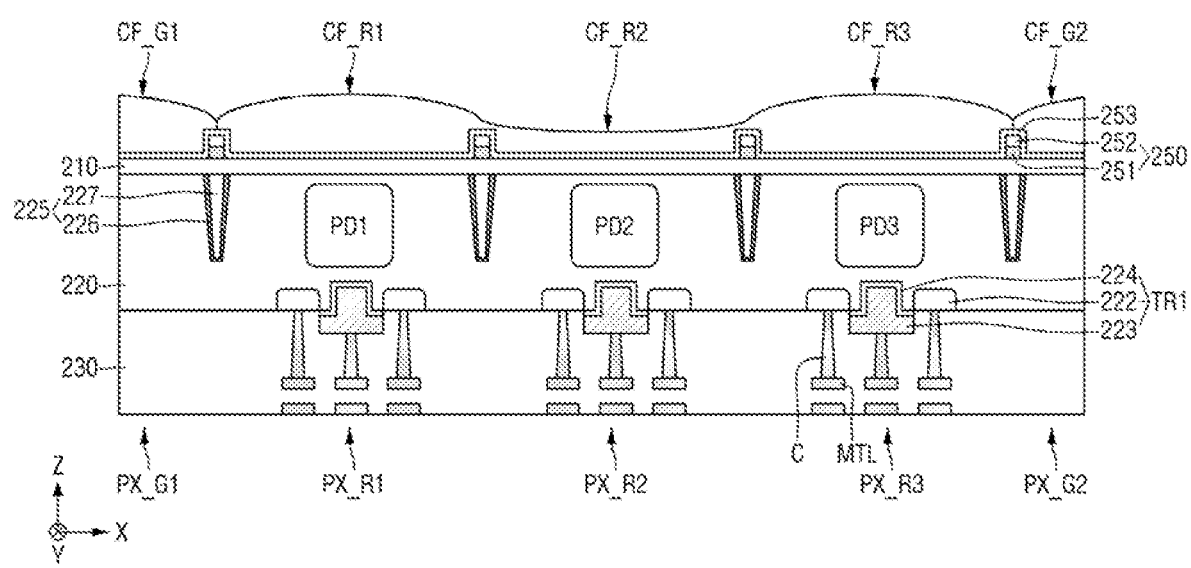

Referring to FIG. 13, a development process may be performed after the photolithography process has been performed. As the development process is performed, only the cured portions of the photoresist PR_R, PR_G1 and PR_G2 may remain. As the photolithography process is performed using the layout LO, the thickness of the second red color filter CF_R2 may be smaller than the thicknesses of the first red color filter CF_R1 and the third red color filter CF_R3. Also, the second red color filter CF_R2 may have a concave shape, the first red color filter CF_R1 and the third red color filter CF_R3 may have a convex shape.

Figure 14:
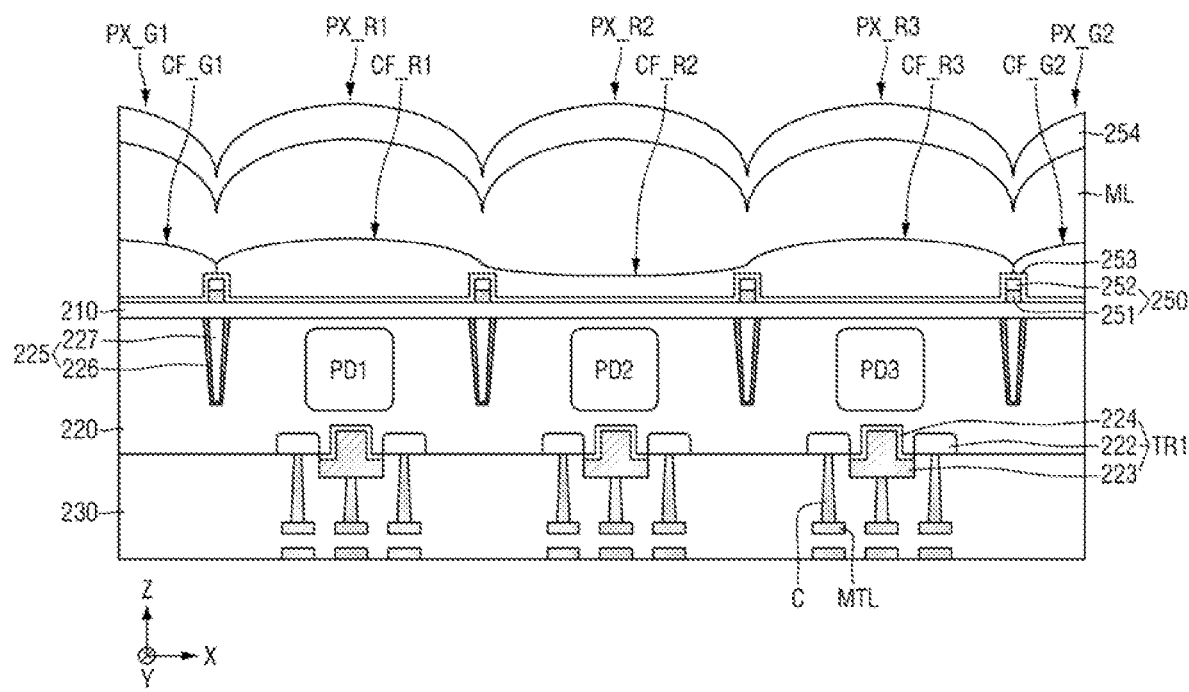

Referring to FIG. 14, a microlens ML and a second liner 254 may be formed on the color filters. Here, the microlens ML and the second liner 254 may be formed by patterning.

For example, the microlens ML and the second liner 254 may be formed to correspond to each pixel PX. As a result of the method described above with reference to FIGS. 9-14, a pixel array 140 including the first pixel array region PA1 may be fabricated.

Hereinafter, an image sensor 100 including a first pixel array region PA1' will be described referring to FIG. 15.

Figure 15:
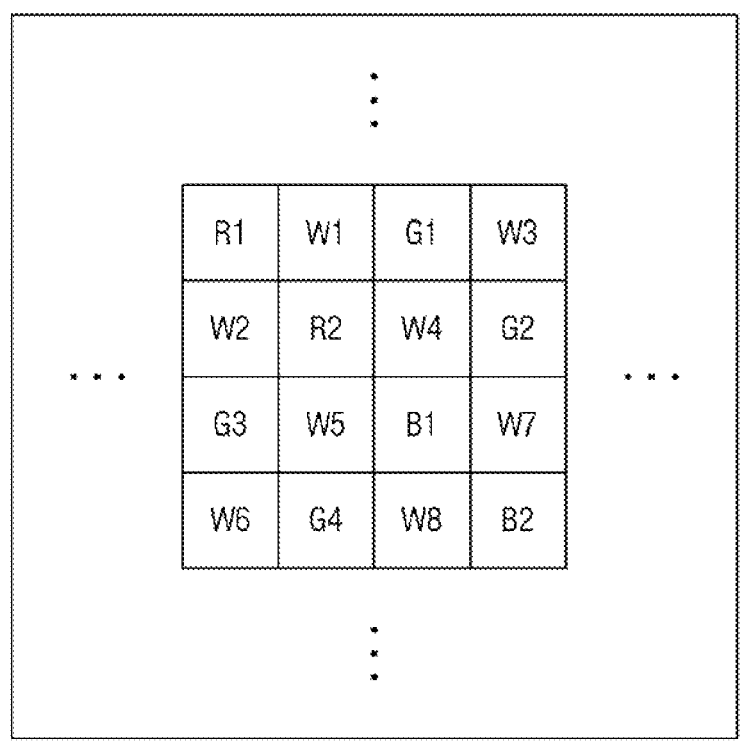
FIG. 15 is a diagram of a pixel array according to some embodiments.

FIG. 15 is a diagram of a pixel array according to some embodiments. For convenience of explanation, repeated description of components from FIGS. 1 to 14 will be briefly described or omitted.

Referring to FIG. 15, the first pixel array region PA1' may include a plurality of pixel groups.

The first pixel array region PA1' may be a pixel array arranged in an RGBW pattern. For example, the first pixel array region PA1' may include first and second red pixel groups R1 and R2, first and second blue pixel groups B1 and B2, first to fourth green pixel groups G1 to G4, and first to eighth white pixel groups W1 to W8 arranged in a particular pattern. The first and second red pixel groups R1 and R2, the first and second blue pixel groups B1 and B2, and the first to fourth green pixel groups G1 to G4 may be surrounded by the first to eighth white pixel groups W1 to W8.

Here, each pixel group may include nine pixels PX, as shown in FIG. 5. For example, the first pixel array region PA1' may correspond to the RGBW nona pattern. Unlike the first pixel array region PA1, the first pixel array region PA1' may include white pixels, and thus, sensing sensitivity of the image sensor 100 including the first pixel array region PA1' may further increase.

Hereinafter, an image sensor 100 including a second pixel array region PA2 will be described referring to FIGS. 16 to 19.

Figure 16:
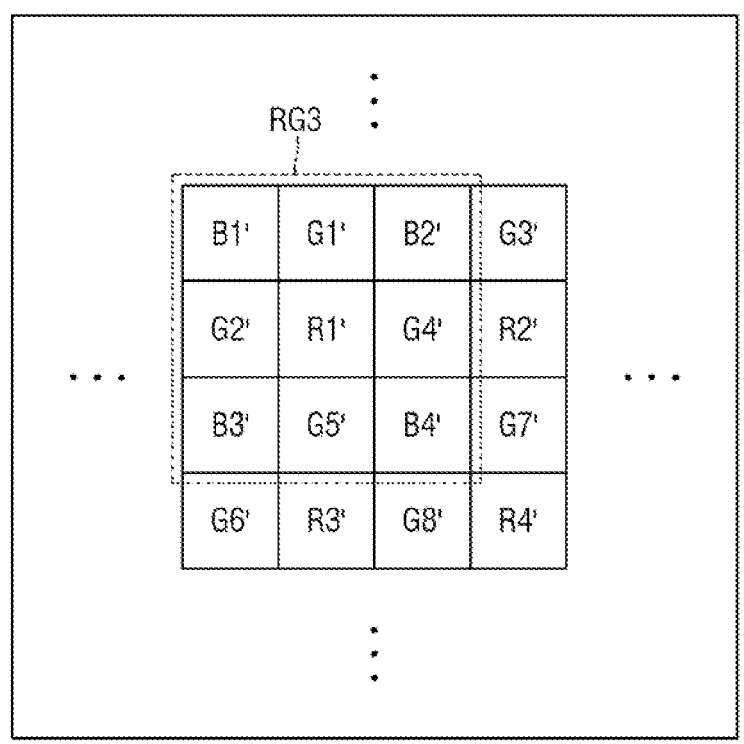
FIG. 16 is a diagram of a pixel array according to some embodiments.
Figure 17:
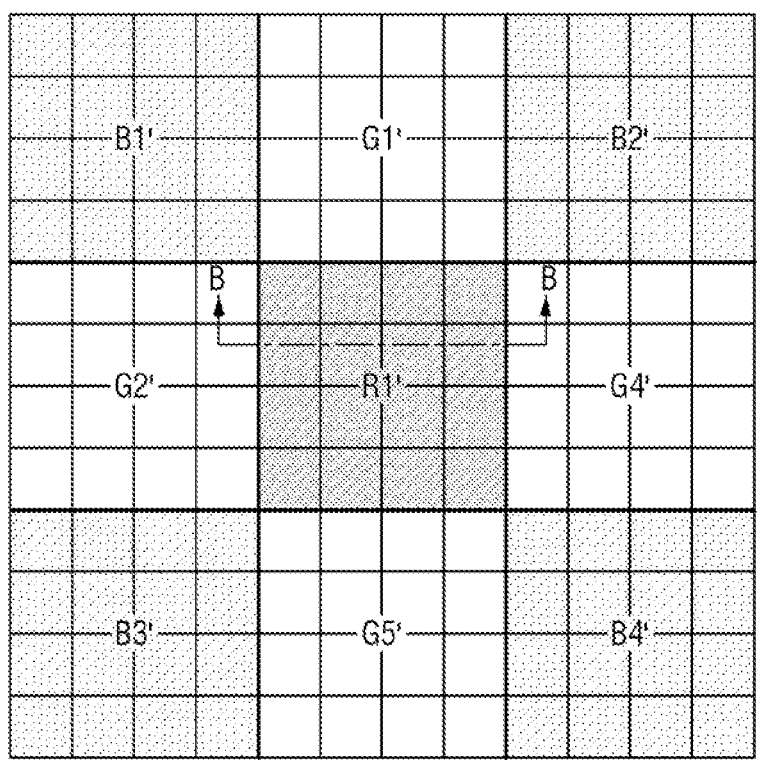
FIG. 17 is an enlarged view of a RG3 region of FIG. 16.
Figure 18:
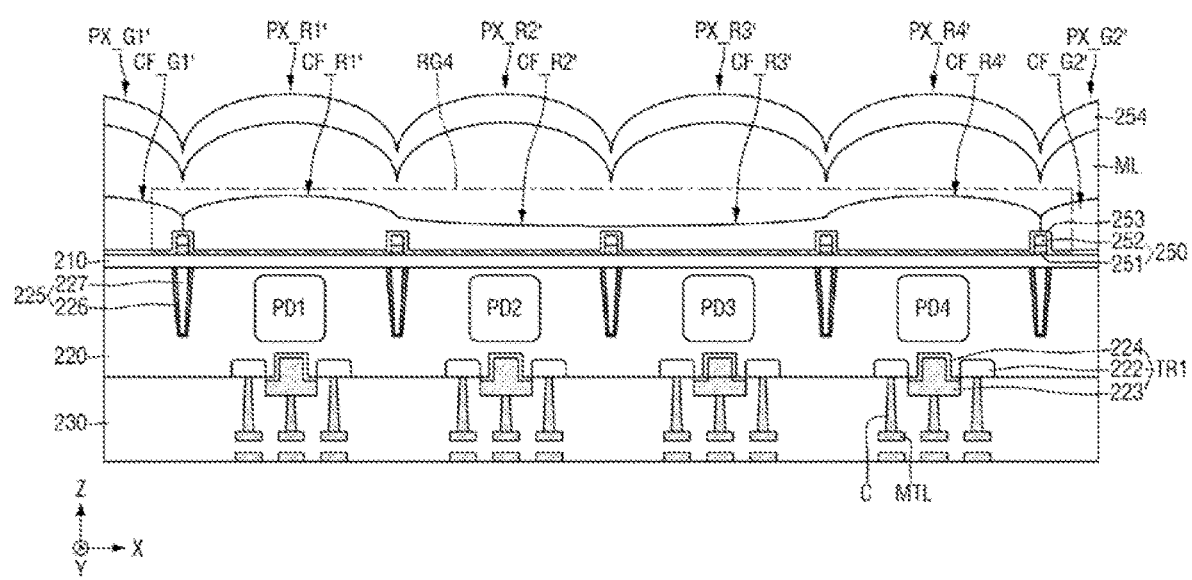
FIG. 18 is a cross-sectional view of a pixel array taken along B-B of FIG. 17.
Figure 19:
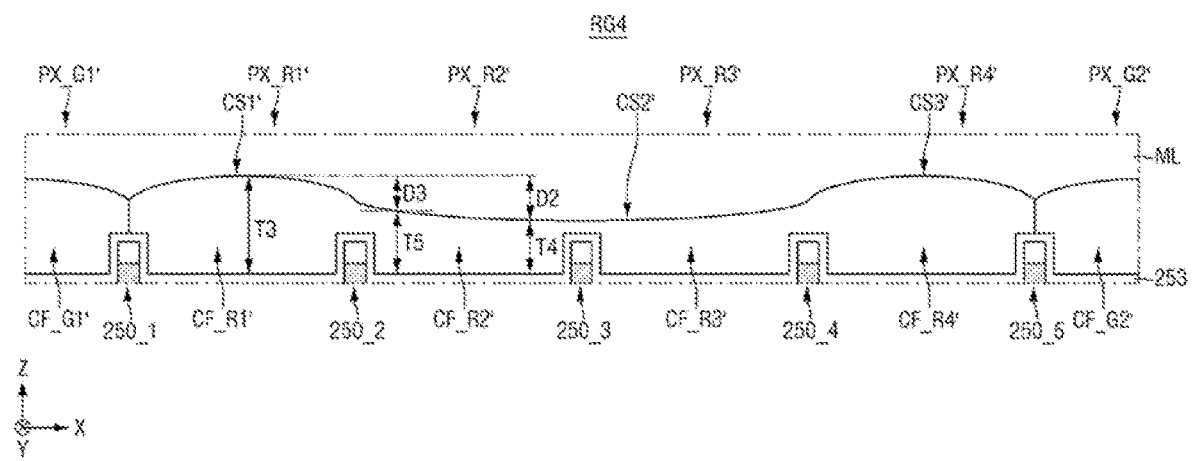
FIG. 19 is an enlarged view of a RG4 region of FIG. 18.

FIG. 16 is a diagram of a pixel array according to some embodiments. FIG. 17 is an enlarged view of a RG3 region of FIG. 16. FIG. 18 is a cross-sectional view of a pixel array taken along B-B of FIG. 17. FIG. 19 is an enlarged view of a RG4 region of FIG. 18. For convenience of explanation, repeated parts of contents described referring to FIGS. 1 to 15 will be briefly described or omitted.

Referring to FIG. 16, the second pixel array region PA2 may include a plurality of pixel groups.

The second pixel array region PA2 may be a pixel array arranged in an RGB pattern. For example, the second pixel array region PA2 may include first to fourth red pixel groups R1' to R4', first to fourth blue pixel groups B1' to B4', and first to eighth green pixel groups G1' to G8' arranged in a particular pattern. Here, the first to fourth red pixel groups R1' to R4' may be surrounded by the first to eighth green pixel groups G1' to G8', and the first to fourth blue pixel groups B1' to B4' may be surrounded by the first to eighth green pixel groups G1' to G8'.

Referring to FIG. 17, the second pixel array region PA2 of the RG3 region may include a pixel group arranged in an RGB hexadeca pattern. For example, the second pixel array region PA2 of the RG3 region may include a first red pixel group R1', first to fourth green pixel groups B1' to B4', a first green pixel group G1', a second green pixel group G2', a fourth green pixel group G4', and a fifth green pixel group G5'. Here, each pixel group may include a plurality of pixels PX. For example, the first red pixel group R1' may include sixteen pixels PX. In this case, as one pixel group includes sixteen pixels PX, the second pixel array region PA2 may correspond to the RGB hexadeca pattern.

Pixels PX of the first red pixel group R1' may be arranged in a 4×4 pattern. For example, in the first red pixel group R1', four pixels PX are arranged in the first direction X to form a row, and four rows may be arranged second direction Y. The first red pixel group R1' may include four center pixels PX_CN, and twelve edge pixels PX_ED that surround the center pixels PX_CN.

Referring to FIG. 18, the pixels PX may include a first green pixel PX_G1', a first red pixel PX_R1', a second red pixel PX_R2', a third red pixel PX_R3', a fourth red pixel PX_R4', and a second green pixel PX_G2'. The first green pixel PX_G1', the first red pixel PX_R1', the second red pixel PX_R2', the third red pixel PX_R3', the fourth red pixel PX_R4' and the second green pixel PX_G2' may be arranged sequentially along the first direction X.

The first green pixel PX_G1' may include a first green color filter CF_G1', the first red pixel PX_R1' may include a first red color filter CF_R1', the second red pixel PX_R2' may include a second red color filter CF_R2', the third red pixel PX_R3' may include a third red color filter CF_R3', the fourth red pixel PX_R4' may include a fourth red color filter CF_R4', and the second green pixel PX_G2' may include a second green color filter CF_G2'. The first green color filter CF_G1', the first red color filter CF_R1', the second red color filter CF_R2', the third red color filter CF_R3', the fourth red color filter CF_R4', and the second green color filter CF_G2' may be arranged sequentially. The first red color filter CF_R1', the second red color filter CF_R2', the third red color filter CF_R3' and the fourth red color filter CF_R4' may be the red color filters of the same color. For example, the first red color filter CF_R1', the second red color filter CF_R2', the third red color filter CF_R3', and the fourth red color filter CF_R4' may each filter incident light by each allowing a certain band of wavelengths to pass through (e.g., the same band of wavelengths). Likewise, the first green color filter CF_G1' and the second green color filter CF_G2' may be green color filters of the same color.

Referring to FIG. 19, an upper surface of the first red color filter CF_R1' may be a first curved surface CS1', upper surfaces of the second red color filter CF_R2' and the third red color filter CF_R3' may be a second curved surface CS2', and an upper surface of the fourth red color filter CF_R4' may be a third curved surface CS3'. The second curved surface CS2' may be, for example, an integral curved surface corresponding to the second red pixel PX_R2' and the third red pixel PX_R3'. The first curved surface CS1' may have a convex shape, the second curved surface CS2' may have a concave shape, and the third curved surface CS3' may have a convex shape. The first curved surface to the third curved surface CS1' to CS3' may be connected to each other.

A thickness of the first red color filter CF_R1' may be a third thickness T3. A thickness of a portion of the second red color filter CF_R2' adjacent to the second grid pattern 250_2 may be a fifth thickness T5, and a thickness of a portion of the second red color filter CF_R2' adjacent to the third grid pattern 250_3 may be a fourth thickness T4.

The third thickness T3 may be greater than both the fourth thickness T4 and the fifth thickness T5. For example, the third thickness T3 may be greater than the fourth thickness T4 by a second distance D2, and may be greater than the fifth thickness T5 by a third distance D3. The fifth thickness T5 may be greater than the fourth thickness T4. For example, the second red color filter CF_R2', which corresponds to the second red pixel PX_R2', may be formed asymmetrically. Similarly, the third red color filter CF_R3' may also be formed asymmetrically as well. Because the thickness of the second red color filter CF_R2' and the third red color filter CF_R3' is less than the thickness of the first red color filter CF_R1' and the fourth red color filter CF_R4', the sensitivity of the center pixels PX_R2' and PX_R3' may be uniform with the surrounding edge pixels, and image quality of the image sensor 100 may be increased.

Figure 20:
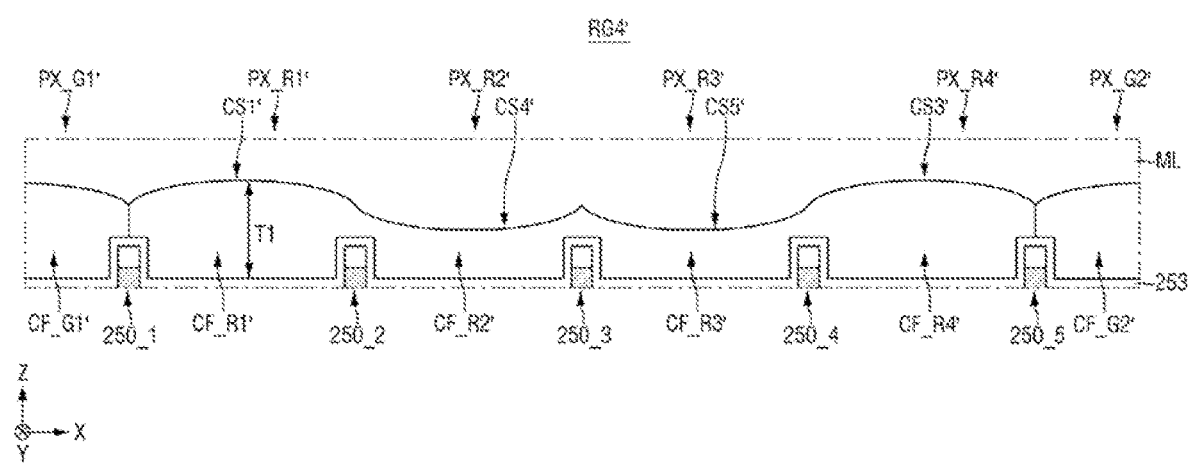
FIG. 20 is an enlarged view of a RG4' region of FIG. 18.

FIG. 20 is an enlarged view of a RG4' region of FIG. 18.

Referring to FIG. 20, the upper surface of the second red color filter CF_R2' may be a fourth curved surface CS4', and the upper surface of the third red color filter CF_R3' may be a fifth curved surface CS5'. The fourth curved surface CS4' may have a concave shape, and the fifth curved surface CS5' may have a concave shape. For example, unlike that shown in FIG. 19, the fourth curved surface CS4' and the fifth curved surface CS5' may each have an independent concave shape. For example, the fourth curved surface CS4' and the fifth curved surface CS5' may each be symmetrically formed. However, the embodiments of the present disclosure are not necessarily limited thereto.

Hereinafter, an electronic device 2000 according to some embodiments will be described referring to FIGS. 21 and 22.

Figure 21:
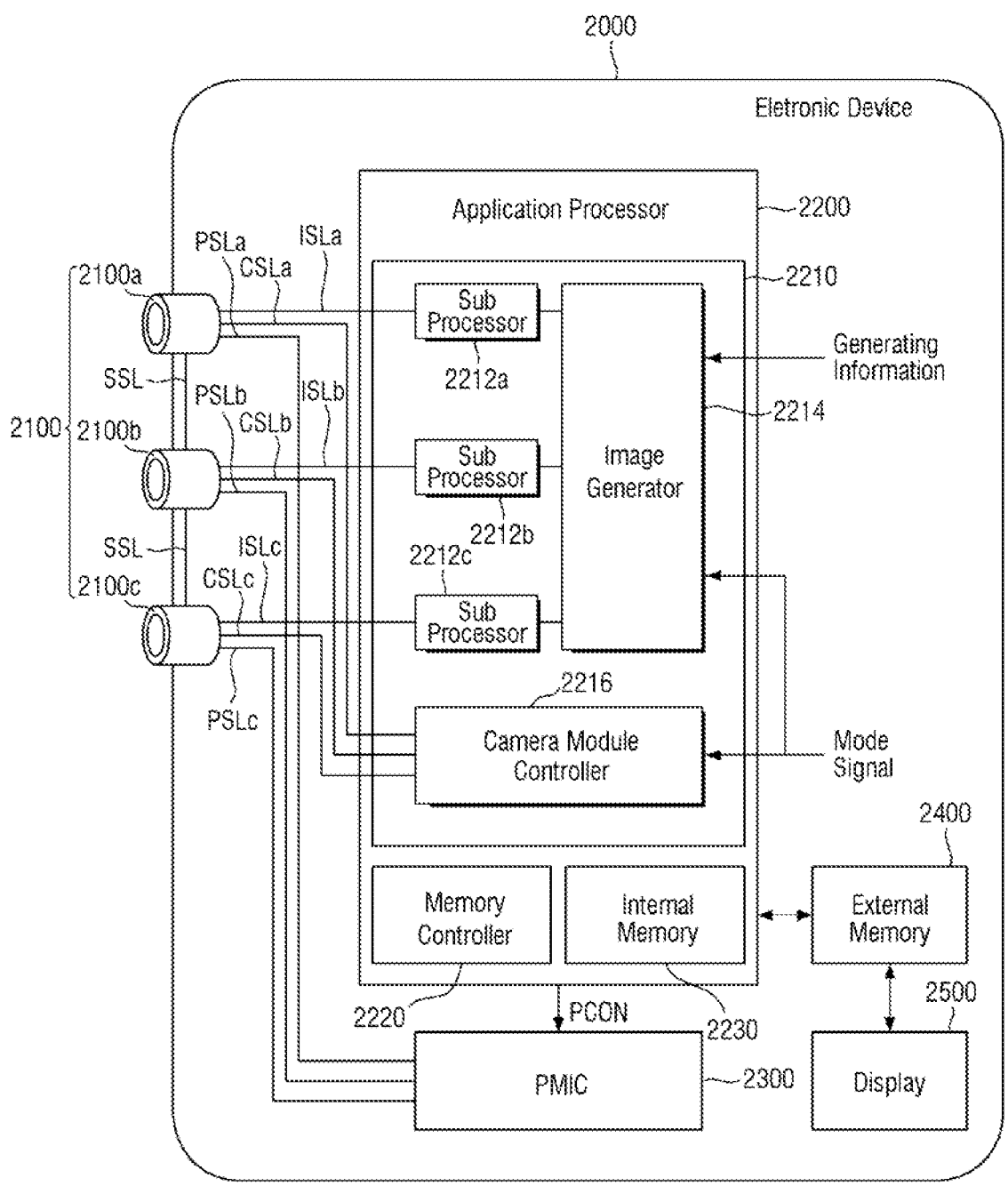
FIG. 21 is a block diagram of an electronic device including a multi-camera module according to some embodiments.

FIG. 21 is a block diagram of an electronic device including a multi-camera module according to some embodiments. FIG. 22 is a detailed block diagram of the camera module of FIG. 21. For convenience of explanation, repeated of components from FIGS. 1 to 20 will be briefly explained or omitted.

Referring to FIG. 21, the electronic device 2000 may include a camera module group 2100, an application processor 2200, a PMIC 2300, an external memory 2400, and a display 2500.

The camera module group 2100 may include a plurality of camera modules 2100a, 2100b and 2100c. Though FIG. 21 illustrates three camera modules 2100a, 2100b and 2100c placed in an embodiment, the embodiments are not necessarily limited thereto. In some embodiments, the camera module group 2100 may be modified to include only two camera modules. Also, in some embodiments, the camera module group 2100 may be modified to include n (n is a natural number equal to or greater than 4) camera modules.

Here, one of the three camera modules 2100a, 2100b, and 2100c may include the image sensor 100 explained using FIGS. 1 to 20. For example, the image sensor 100 of the camera modules 2100a, 2100b and 2100c may include a first pixel array region PA1 and a second pixel array region PA2.

Hereinafter, although the detailed configuration of the camera module 2100b will be explained in more detail referring to FIG. 22, the following explanation may also be equally applied to other camera modules 2100a and 2100c depending on the embodiment.

Figure 22:
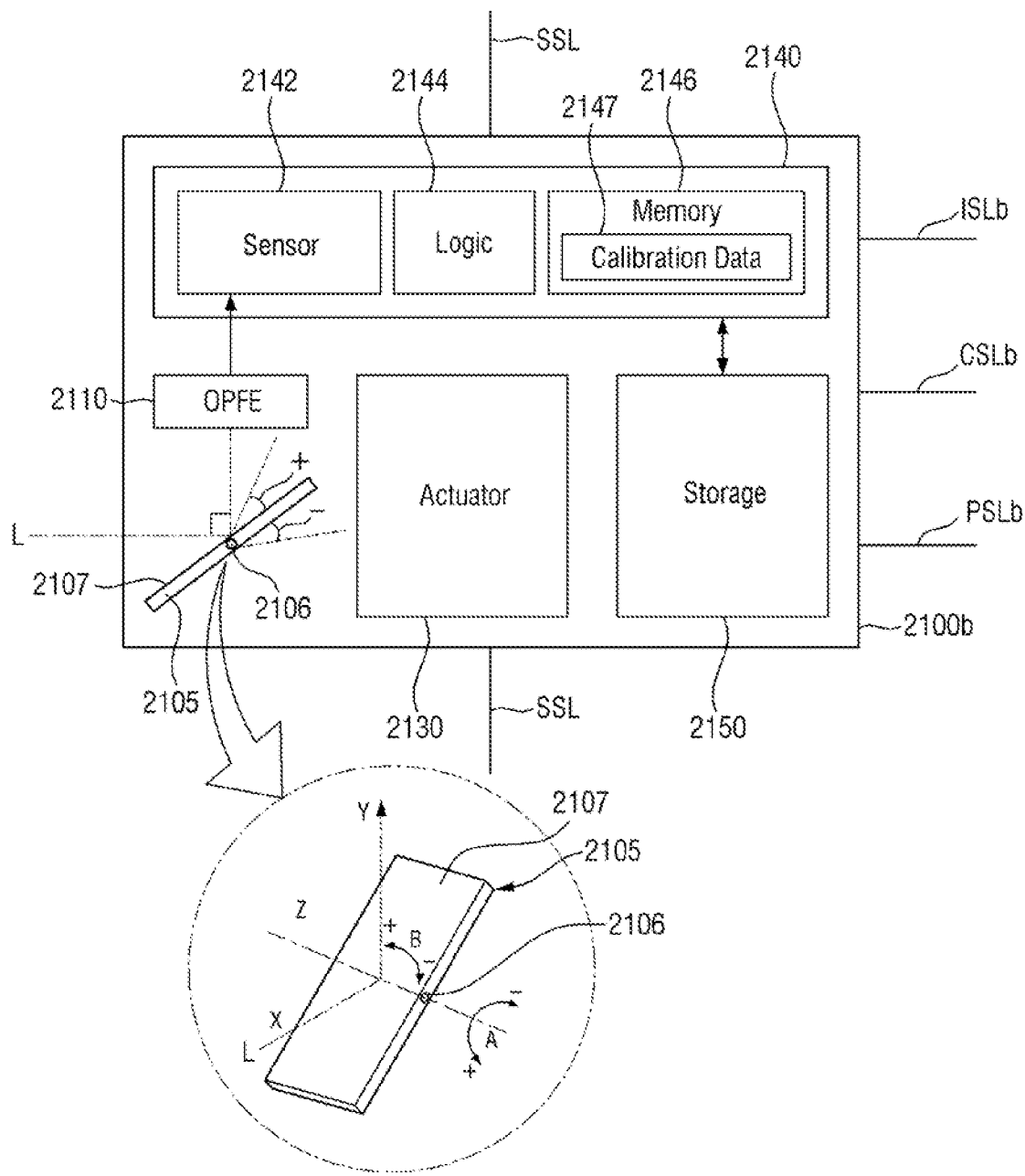
FIG. 22 is a detailed block diagram of the camera module of FIG. 21.

Referring to FIG. 22, the camera module 2100b may include a prism 2105, an optical path folding element (hereinafter, "OPFE") 2110, an actuator 2130, an image sensing device 2140, and a storage unit 2150.

The prism 2105 may include a reflecting surface 2107, which includes a light-reflecting material, to modify the path of light L that is incident from the outside.

In some embodiments, the prism 2105 may change the path of light L incident in the first direction X to a second direction Y perpendicular to the first direction X. Further, the prism 2105 may rotate the reflecting surface 2107 of the light-reflecting material in a direction A around a central axis 2106 or rotate the central axis 2106 in a direction B to change the path of the light L incident in the first direction X into the vertical second direction Y. The OPFE 2110 may also move in a third direction Z that is perpendicular to the first direction X and the second direction Y.

Although FIG. 22 illustrates a maximum rotation angle of the prism 2105 in the direction A is equal to or less than 15 degrees in a positive (+) direction A, and may be greater than 15 degrees in a negative (−) direction A, the embodiments are not necessarily limited thereto.

In some embodiments, the prism 2105 may move about 20 degrees, or between 10 and 20 degrees, or between 15 and 20 degrees in the positive (+) or negative (−) direction B. Here, the moving angle may move at the same angle in the positive (+) or negative (−) direction B, or may move to almost the same angle within the range of about 1 degree.

In some embodiments, the prism 2105 may move the reflecting surface 2107 of the light-reflecting material in the third direction (e.g., a direction Z) parallel to an extension direction of the central axis 2106.

The OPFE 2110 may include, for example, an optical lens including m (where m is a natural number) groups. The m lenses may move in the second direction Y to change an optical zoom ratio of the camera module 2100b. For example, when a basic optical zoom ratio of the camera module 2100b is set as Z, if them optical lenses included in the OPFE 2110 are moved, the optical zoom ratio of the camera module 2100b may be changed to the optical zoom ratio of 3Z or 5Z or higher.

The actuator 2130 may move the OPFE 2110 or an optical lens (hereinafter, referred to as an optical lens) to a specific position. For example, the actuator 2130 may adjust the position of the optical lens so that the image sensor 2142 is located at a focal length of the optical lens for accurate sensing.

The image sensing device 2140 may include an image sensor 2142, control logic 2144 and a memory 2146. The image sensor 2142 may sense an image using light L provided through the optical lens. In some embodiments, the image sensor 2142 may include the image sensor 100 described above.

The control logic 2144 may control the overall operation of the camera module 2100b. For example, the control logic 2144 may control the operation of the camera module 2100b in accordance with the control signal provided through the control signal line CSLb.

The memory 2146 may store information necessary for the operation of the camera module 2100b such as calibration data 2147. The calibration data 2147 may include information necessary for the camera module 2100b to generate image data, using the light L provided from the outside. For example, the calibration data 2147 may include information that assists the camera module 2100b in generating accurate image data. The calibration data 2147 may include, for example, information on the degree of rotation, information on the focal length, information on the optical axis explained above, and the like. If the camera module 2100b is implemented in the form of a multi-state camera whose focal length changes depending on the position of the optical lens, the calibration data 2147 may include information about the focal length values and auto focusing for each position (or for each state) of the optical lens.

The storage unit 2150 may store the image data sensed through the image sensor 2142. The storage unit 2150 may be placed outside the image sensing device 2140, and may be implemented in the form of being stacked with sensor chips constituting the image sensing device 2140. In some embodiments, although the storage unit 2150 may be implemented as an EEPROM (Electrically Erasable Programmable Read-Only Memory), the embodiments are not necessarily limited thereto.

Referring to FIGS. 21 and 22 together, in some embodiments, each of the plurality of camera modules 2100a, 2100b, and 2100c may include an actuator 2130. Accordingly, each of the plurality of camera modules 2100a, 2100b, and 2100c may include calibration data 2147 that is the same as or different from each other according to the operation of the actuator 2130 included therein.

In some embodiments, one camera module (e.g., 2100b) among the plurality of camera modules 2100a, 2100b, and 2100c is a folded lens type camera module including the prism 2105 and the OPFE 2110 described above, and the remaining camera modules (e.g., 2100a and 2100c) may be vertical camera modules which do not include the prism 2105 and the OPFE 2110. However, the embodiments are not necessarily limited thereto.

In some embodiments, one camera module (e.g., 2100c) among the plurality of camera modules 2100a, 2100b, and 2100c may be a vertical depth camera which extracts depth information, for example, using an IR (e.g., infrared) beam. In this case, the application processor 2200 may merge the image data provided from such a depth camera with the image data provided from another camera module (e.g., 2100a or 2100b) to generate a three-dimensional (3D) depth image.

In some embodiments, at least two camera modules (e.g., 2100a and 2100c) among the plurality of camera modules 2100a, 2100b, and 2100c may have fields of view that are different from each other. In this case, for example, although the optical lenses of at least two camera modules (e.g., 2100a and 2100c) among the plurality of camera modules 2100a, 2100b, and 2100c may be different from each other, the embodiments are not necessarily limited thereto.

Also, in some embodiments, viewing angles of each of the plurality of camera modules 2100a, 2100b, and 2100c may be different from each other. In this case, although the optical lenses included in each of the plurality of camera modules 2100a, 2100b, and 2100c may also be different from each other, the embodiments are not necessarily limited thereto.

In some embodiments, each of the plurality of camera modules 2100a, 2100b, and 2100c may be placed to be physically separated from each other. For example, the sensing region of one image sensor 2142 might not be commonly used by a plurality of camera modules 2100a, 2100b, and 2100c, but an independent image sensor 2142 may be placed inside each of the plurality of camera modules 2100a, 2100b, and 2100c.

Referring to FIG. 21 again, the application processor 2200 may include an image processing device 2210, a memory controller 2220, and an internal memory 2230. The application processor 2200 may be implemented separately from the plurality of camera modules 2100a, 2100b, and 2100c. For example, the application processor 2200 and the plurality of camera modules 2100a, 2100b, and 2100c may be implemented separately as separate semiconductor chips.

The image processing device 2210 may include a plurality of sub-image processors 2212a, 2212b, and 2212c, an image generator 2214, and a camera module controller 2216.

The image processing device 2210 may include a plurality of sub-image processors 2212a, 2212b, and 2212c which correspond to the number of the plurality of camera modules 2100a, 2100b, and 2100c.

Image data generated from each of the camera modules 2100a, 2100b, and 2100c may be provided to the corresponding sub-image processors 2212a, 2212b, and 2212c through image signal lines ISLa, ISLb, and ISLc separated from each other. For example, the image data generated from the camera module 2100a is provided to the sub-image processor 2212a through the image signal line ISLa, the image data generated from the camera module 2100b is provided to the sub-image processor 2212b through the image signal line ISLb, and the image data generated from the camera module 2100c may be provided to the sub-image processor 2212c through the image signal line ISLc. Although such an image data transmission may be performed using, for example, a camera serial interface (CSI) based on a mobile industry processor interface (MIPI), the embodiments are not necessarily limited thereto.

On the other hand, in some embodiments, a single sub-image processor may be placed to correspond to a plurality of camera modules. For example, the sub-image processor 2212a, the sub-image processor 2212b, and the sub-image processor 2212c might not implemented separately from each other as shown, but may be implemented by being integrated as a single sub-image processor. The image data provided from the camera module 2100a and the camera module 2100c may be selected through a selection element (e.g., a multiplexer) or the like and then provided to an integrated sub-image processor.

The image data provided to the respective sub-image processors 2212a, 2212b, and 2212c may be provided to the image generator 2214. The image generator 2214 may generate the output image, using the image data provided from the respective sub-image processors 2212a, 2212b, and 2212c according to image generating information or the mode signal.

Specifically, the image generator 2214 may merge at least some of the image data generated from the camera modules 2100a, 2100b, and 2100c having different viewing angles to generate the output image, in accordance with the image generating information or the mode signal. Further, the image generator 2214 may select any one of the image data generated from the camera modules 2100a, 2100b, and 2100c having different viewing angles to generate the output image, in accordance with the image generating information or the mode signal.

In some embodiments, the image generating information may include a zoom signal (or a zoom factor). Also, in some embodiments, the mode signal may be, for example, a signal based on the mode selected from a user.

When the image generating information is a zoom signal (a zoom factor) and each of the camera modules 2100a, 2100b, and 2100c has fields of view (viewing angles) different from each other, the image generator 2214 may perform different operations depending on the type of zoom signals. For example, when the zoom signal is a first signal, the image data output from the camera module 2100a and the image data output from the camera module 2100c are merged, and then an output image may be generated, using the merged image signal. In this case, the image data output from the camera module 2100b might not be used for merging. If the zoom signal is a second signal that is different from the first signal, the image generator 2214 does not merge the image data, and may select any one of the image data output from each of the camera modules 2100a, 2100b, and 2100c to generate the output image. However, the embodiments are not necessarily limited thereto, and a method of processing the image data may be modified as much as necessary.

In some embodiments, the image generator 2214 may receive a plurality of image data with different exposure times from at least one of the plurality of sub-image processors 2212a, 2212b, and 2212c, and perform high dynamic range (HDR) processing on the plurality of image data to generate merged image data with an increased dynamic range.

The camera module controller 2216 may provide the control signal to each of the camera modules 2100a, 2100b, and 2100c. The control signals generated from the camera module controller 2216 may be provided to the corresponding camera modules 2100a, 2100b, and 2100c through the control signal lines CSLa, CSLb and CSLc separated from each other.

One of the plurality of camera modules 2100a, 2100b, and 2100c is designated as a master camera (e.g., 2100a) depending on the image generating information including the zoom signal or the mode signal, and the remaining camera modules (e.g., 2100b and 2100c) may be designated as slave cameras. This information is included in the control signal, and may be provided to the corresponding camera modules 2100a, 2100b, and 2100c through the control signal lines CSLa, CSLb and CSLc.

The camera modules that operate as master and slave may be modified depending on the zoom factor or the operating mode signal. For example, if the viewing angle of the camera module 2100a is wider than that of the camera module 2100c and the zoom factor exhibits a low zoom ratio, the camera module 2100c may operate as the master, and the camera module 2100a may operate as the slave. In contrast, when the zoom factor exhibits a high zoom ratio, the camera module 2100a may operate as the master and the camera module 2100c may operate as the slave.

In some embodiments, the control signal provided from the camera module controller 2216 to the respective camera modules 2100a, 2100b, and 2100c may include a sync enable signal. For example, if the camera module 2100b is the master camera and the camera modules 2100a and 2100c are the slave cameras, the camera module controller 2216 may transmit the sync enable signal to the camera module 2100b. The camera module 2100b, which receives the sync enable signal, generates a sync signal on the basis of the received sync enable signal, and may provide the generated sync signal to the camera modules 2100a and 2100c through the sync signal line SSL. The camera module 2100b and the camera modules 2100a and 2100c may transmit the image data to the application processor 2200 in synchronization with such a sync signal.

In some embodiments, the control signal provided from the camera module controller 2216 to the plurality of camera modules 2100a, 2100b, and 2100c may include mode information according to the mode signal. On the basis of the mode information, the plurality of camera modules 2100a, 2100b, and 2100c may operate in a first operating mode and a second operating mode in connection with sensing speed.

The plurality of camera modules 2100a, 2100b, and 2100c may generate an image signal at the first speed in the first operating mode (for example, generate an image signal of a first frame rate), encode the image signal at a second speed higher than the first speed (for example, encode an image signal of a second frame rate higher than the first frame rate), and transmit the encoded image signal to the application processor 2200. For example, the second speed may be 30 times faster than the first speed.

The application processor 2200 may store the received image signal, e.g., the encoded image signal, in the memory 2230 provided inside or an external storage 2400 of the application processor 2200, and then read and decode the encoded image signal from the memory 2230 or the storage 2400, and display image data generated from the decoded image signal. For example, the corresponding sub-processors among the plurality of sub-processors 2212a, 2212b, and 2212c of the image processing device 2210 may perform decoding, and may also perform the image processing on the decoded image signal. For example, the image data generated on the basis of the decoded image signal may be displayed on the display 2500.

A plurality of camera modules 2100a, 2100b, and 2100c may generate image signals at a third speed lower than the first speed in the second operating mode (for example, generate an image signal of a third frame rate lower than the first frame rate), and transmit the image signal to the application processor 2200. The image signal provided to the application processor 2200 may be, for example, a non-encoded signal. The application processor 2200 may perform the image processing on the received image signal or store the image signal in the memory 2230 or the storage 2400.

The PMIC 2300 may supply a power, e.g., a power supply voltage, to each of the plurality of camera modules 2100a, 2100b, and 2100c. For example, the PMIC 2300 may supply a first power to the camera module 2100a through a power signal line PSLa, supply a second power to the camera module 2100b through a power signal line PSLb, and supply a third power to the camera module 2100c through a power signal line PSLc, under the control of the application processor 2200.

The PMIC 2300 may generate power corresponding to each of the plurality of camera modules 2100a, 2100b, and 2100c and adjust the level of power, in response to a power control signal PCON from the application processor 2200. The power control signal PCON may include power adjustment signals for each operating mode of the plurality of camera modules 2100a, 2100b, and 2100c. For example, the operating mode may include a low power mode, and at this time, the power control signal PCON may include information about the camera module that operates in the low power mode and a power level to be set. The levels of powers provided to each of the plurality of camera modules 2100a, 2100b, and 2100c may be the same as or different from each other. Also, the levels of power may be changed dynamically.

An image sensor according to the present disclosure may have a color filter with a decreased thickness disposed on a center pixel(s) in a pixel group. The color filter disposed on the center pixel(s) may have a concave shape. Pixels that are adjacent to pixels of different colors may have increased sensitivity due to signal crosstalk. Since the color filter disposed on the center pixel(s) has a lower thickness than the thickness of the color filter disposed on the adjacent pixels, the sensitivity of the center pixel(s) may be increased to more closely match the sensitivity of the adjacent pixels. Accordingly, the pixel sensitivity of a pixel array in an image sensor according to the present disclosure may have a uniform sensitivity. Accordingly, the image quality of an image sensor according to the present disclosure may be increased.

In concluding the detailed description, those skilled in the art will appreciate that many variations and modifications may be made to the preferred embodiments without substantially departing from the principles of the present disclosure. Therefore, the disclosed preferred embodiments of the invention are used in a generic and descriptive sense only and not for purposes of limitation.

What is claimed is:

1. An image sensor comprising:
 a substrate;
 a first grid pattern disposed on the substrate, including a first side wall and a second side wall opposite to the first side wall;
 a second grid pattern disposed on the substrate and spaced apart from the first grid pattern to a first direction, wherein the second grid pattern includes a third side wall and a fourth side wall opposite to the third side wall;

a first pixel, including a first photoelectric conversion element and a first color filter;

a second pixel, including a second photoelectric conversion element and a second color filter; and a third pixel, including a third photoelectric conversion element and a third color filter, wherein the first color filter contacts the first side wall, wherein the second color filter contacts the second side wall and the third side wall, wherein the third color filter contacts the fourth side wall, wherein the first photoelectric conversion element, the second photoelectric conversion element, and the third photoelectric conversion element are disposed inside the substrate, wherein the first color filter, the second color filter, and the third color filter are disposed on the substrate, wherein the first color filter and the second color filter are color filters of a different color, wherein the second color filter and the third color filter are color filters of a same color, wherein a first thickness of the first color filter is greater than a second thickness of the third color filter, and wherein a third thickness of the second color filter is greater than the second thickness of the third color filter.

2. The image sensor of claim 1, wherein a third thickness of the third color filter is greater than the second thickness of the second color filter.

3. The image sensor of claim 1, further comprising: a third grid pattern disposed on the substrate and including a fifth side wall and a sixth side wall opposite to the fifth side wall; and a fourth pixel including a fourth photoelectric conversion element and a fourth color filter, wherein the third color filter contacts the fifth side wall, wherein the fourth color filter contacts the sixth side wall, and wherein the fourth photoelectric conversion element is disposed inside the substrate.

4. The image sensor of claim 3, wherein a fourth thickness of the fourth color filter is greater than each of the second thickness of the second color filter and the third thickness of the third color filter.

5. The image sensor of claim 3, wherein a thickness of the second color filter adjacent to the second side wall is greater than a thickness of the second color filter adjacent to the third side wall.

6. The image sensor of claim 3, wherein the second color filter and the third color filter cover the second grid pattern.

7. The image sensor of claim 1, further comprising:
a first microlens covering the first color filter, and
a second microlens covering the second color filter, and
wherein a thickness of the second microlens is greater than a thickness of the first microlens.

8. The image sensor of claim 1, wherein the first color filter and the second color filter cover the first grid pattern.

9. The image sensor of claim 1, wherein an upper surface of the first grid pattern is exposed.

10. An image sensor comprising:
a substrate;
a first grid pattern disposed on the substrate including a first side wall and a second side wall opposite to the first side wall;
a second grid pattern disposed on the substrate and spaced apart from the first grid pattern to a first direction, wherein the second grid pattern includes a third side wall and a fourth side wall opposite to the third side wall;

a first pixel, including a first photoelectric conversion element and a first color filter;

a second pixel, including a second photoelectric conversion element and a second color filter;

a third pixel, including a third photoelectric conversion element and a third color filter, wherein the first color filter contacts the first side wall, wherein the second color filter contacts the second side wall and the third side wall, wherein the third color filter contacts the fourth side wall, wherein the first photoelectric conversion element, the second photoelectric conversion element, and the third photoelectric conversion element are disposed inside the substrate, wherein the first color filter, the second color filter, and the third color filter are disposed on the substrate, wherein the first color filter and the second color filter are color filters of a different color, wherein the second color filter and the third color filter are color filters of a same color, and wherein the first color filter and the second color filter have a convex shape, and the third color filter has a concave shape.

11. The image sensor of claim 10, wherein the third color filter has a convex shape.

12. The image sensor of claim 10, further comprising: a third grid pattern disposed on the substrate and including a fifth side wall and a sixth side wall opposite to the fifth side wall; and a fourth pixel including a fourth photoelectric conversion element and a fourth color filter, wherein the third color filter contacts the fifth side wall, wherein the fourth color filter contacts the sixth side wall, wherein the fourth photoelectric conversion element is disposed inside the substrate, and wherein the fourth color filter has a convex shape.

13. The image sensor of claim 12, wherein the second color filter and the third color filter have integrally a concave shape.

14. An image sensor comprising:
a substrate;
a first pixel including a first photoelectric conversion element disposed inside the substrate and a first color filter disposed on the substrate;
a second pixel including a second photoelectric conversion element disposed inside the substrate and a second color filter disposed on the substrate;
a third pixel including a third photoelectric conversion element disposed inside the substrate and a third color filter disposed on the substrate; and
a fourth pixel including a fourth photoelectric conversion element disposed inside the substrate and a fourth color filter disposed on the substrate,
wherein the second pixel is disposed between the first pixel and the third pixel,
wherein the third pixel is disposed between the second pixel and the fourth pixel,
wherein the second color filter does not contact the first color filter,
wherein the second color filter, the third color filter, and the fourth color filter are color filters of a same color,
wherein the first color filter is a color filter of a color different from the second color, the third color filter, and the fourth color filter, wherein a first thickness of the second color filter is greater than a second thickness of the third color filter, and wherein a third thickness of the fourth color filter is greater than the second thickness of the third color filter.

15. The image sensor of claim 14, wherein the third color filter contacts the first color filter and the second color filter.

16. The image sensor of claim 14, wherein the second color filter has a concave shape, and the third color filter has a convex shape.

17. The image sensor of claim 14, wherein the first to third color filters include a negative photoresist.

* * * * *